United States Patent
Lee et al.

(10) Patent No.: US 12,426,161 B2
(45) Date of Patent: Sep. 23, 2025

(54) PRINTED CIRCUIT FILM, DISPLAY DEVICE, AND METHOD OF FABRICATING PRINTED CIRCUIT FILM

(71) Applicant: Samsung Display Co., LTD., Yongin-si (KR)

(72) Inventors: Dong Hyun Lee, Anyang-si (KR); Seung Soo Ryu, Hwaseong-si (KR); Sang Hyuck Yoon, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/212,719

(22) Filed: Jun. 22, 2023

(65) Prior Publication Data

US 2023/0337364 A1     Oct. 19, 2023

Related U.S. Application Data

(62) Division of application No. 17/198,197, filed on Mar. 10, 2021, now Pat. No. 11,737,215.

(30) Foreign Application Priority Data

Jun. 8, 2020 (KR) .......... 10-2020-0069147

(51) Int. Cl.
*H05K 1/11* (2006.01)
*G02F 1/1345* (2006.01)
(Continued)

(52) U.S. Cl.
CPC .......... *H05K 1/118* (2013.01); *G02F 1/13452* (2013.01); *H01L 24/32* (2013.01);
(Continued)

(58) Field of Classification Search
CPC .......... H05K 1/118; H05K 1/14; H05K 1/147; H05K 1/189; H01L 23/498;
(Continued)

(56) References Cited

U.S. PATENT DOCUMENTS

| 8,193,706 B2 | 6/2012 | Kim |
| 10,178,769 B2 | 1/2019 | Min et al. |

(Continued)

FOREIGN PATENT DOCUMENTS

| KR | 2011-0055089 | 5/2011 |
| KR | 2017-0084406 | 7/2017 |

(Continued)

OTHER PUBLICATIONS

Non-Final Office Action issued Oct. 6, 2022, in U.S. Appl. No. 17/198,197.

(Continued)

*Primary Examiner* — Julio J Maldonado
*Assistant Examiner* — Stanetta D Isaac
(74) *Attorney, Agent, or Firm* — CANTOR COLBURN LLP

(57) ABSTRACT

A method of fabricating a printed circuit film including the steps of preparing a base film, and a plurality of lead wires disposed on the base film, the plurality of lead wires spaced apart from each other in a first direction and extending in a second direction intersecting the first direction, and forming a bonding member including a conductive member disposed to overlap a central portion of each of the plurality of lead wires, a first non-conductive member disposed to overlap a first portion of the plurality of lead wires in the second direction, and a second non-conductive member disposed to overlap a second portion of the plurality of lead wires in the second direction.

8 Claims, 31 Drawing Sheets

(51) Int. Cl.
*G09G 3/3275* (2016.01)
*H01L 23/00* (2006.01)
*H01L 25/18* (2023.01)
*H05K 1/18* (2006.01)
*H05K 3/22* (2006.01)
*H05K 3/34* (2006.01)
*H10K 59/131* (2023.01)

(52) U.S. Cl.
CPC .............. *H01L 24/83* (2013.01); *H01L 25/18* (2013.01); *H05K 1/189* (2013.01); *H05K 3/22* (2013.01); *H05K 3/3442* (2013.01); *G09G 3/3275* (2013.01); *H01L 2224/32225* (2013.01); *H01L 2224/83047* (2013.01); *H01L 2224/83192* (2013.01); *H01L 2224/83203* (2013.01); *H01L 2224/83815* (2013.01); *H01L 2224/8385* (2013.01); *H01L 2224/83905* (2013.01); *H05K 2201/056* (2013.01); *H05K 2201/10128* (2013.01); *H05K 2201/10136* (2013.01); *H10K 59/131* (2023.02)

(58) Field of Classification Search
CPC ........... H01L 23/49811; H01L 23/4985; H01L 27/3288; H10K 59/131; H10K 59/179
See application file for complete search history.

(56) References Cited

U.S. PATENT DOCUMENTS

| | | |
|---|---|---|
| 10,304,764 B2 | 5/2019 | Chung et al. |
| 10,304,776 B2 | 5/2019 | Kim et al. |
| 10,451,934 B2 | 10/2019 | Furuta |
| 2016/0165718 A1 | 6/2016 | Oh |
| 2019/0109288 A1 | 4/2019 | Li et al. |
| 2020/0105657 A1* | 4/2020 | Lee .................... H01L 23/4985 |
| 2021/0066443 A1* | 3/2021 | Kim .................... H10K 59/131 |

FOREIGN PATENT DOCUMENTS

| | | |
|---|---|---|
| KR | 1020180001672 A | 1/2018 |
| KR | 2018-0024099 | 3/2018 |
| KR | 2018-0035135 | 4/2018 |

OTHER PUBLICATIONS

Notice of Allowance issued May 2, 2023, in U.S. Appl. No. 17/198,197.

* cited by examiner

PRINTED CIRCUIT FILM, DISPLAY DEVICE, AND METHOD OF FABRICATING PRINTED CIRCUIT FILM

CROSS-REFERENCE TO RELATED APPLICATION

This application is a Divisional of U.S. patent application Ser. No. 17/198,197, filed on Mar. 10, 2021, which claims priority from and the benefit of Korean Patent Application No. 10-2020-0069147 filed on Jun. 8, 2020 in the Korean Intellectual Property Office, and all the benefits accruing therefrom under 35 U.S.C. 119, each of which is hereby incorporated by reference for all purposes as if fully set forth herein.

BACKGROUND

Field

Embodiments/implementations of the invention relate generally to a printed circuit film, a display device, and a method of fabricating the printed circuit film.

Description of the Background

A display device is a device for displaying a moving image or a still image. The display device may be used as a display screen of various products such as televisions, laptop computers, monitors, billboards and the Internet of Things (IoT) as well as portable electronic devices such as mobile phones, smart phones, tablet personal computers (tablet PCs), smart watches, watch phones, mobile communication terminals, electronic notebooks, electronic books, portable multimedia players (PMPs), navigation systems and ultra mobile personal computers (UMPCs).

In order to drive a light emitting element of the display device, there is a need of a printed circuit board including a driving circuit, a plurality of signal wires electrically connecting the light emitting elements, and a plurality of lead wires connected to the signal wires. The display device includes a display area where an image is displayed and a portion (e.g., bezel) surrounding the display area, where an image is not displayed. In order to implement a bezel-less design, the signal and lead wires may be bonded to the side surface of the display device e.g., by a side-bonding method.

The above information disclosed in this Background section is only for understanding of the background of the inventive concepts, and, therefore, it may contain information that does not constitute prior art.

SUMMARY

The present inventors realized that when a printed circuit film is bonded to a pad of a display panel by a side-bonding method, an alignment error between a lead of the printed circuit film and the pad of the display panel is caused such that a contact resistance therebetween is increased and a short circuit between adjacent wires is caused.

Display devices with a printed circuit film constructed according to the principles and implementations of the invention are capable of simplifying the fabrication process thereof and improving an alignment error with a pad of a display panel.

Methods of manufacturing the display device with the printed circuit film according to the principles and embodiments of the invention are capable of simplifying the fabrication process and improving an alignment error between a pad of a display panel and a lead of the printed circuit film.

Additional features of the inventive concepts will be set forth in the description which follows, and in part will be apparent from the description, or may be learned by practice of the inventive concepts.

According to one or more embodiments of the invention, a printed circuit film includes: a base film including a first film portion extending in a first direction, a second film portion extending in the first direction, and a third film portion extending in the first direction, the first film portion disposed between the second film portion and the third film portion in a second direction intersecting the first direction; a plurality of lead wires extending in the second direction and disposed on the first, second, and third film portions, the plurality of lead wires being spaced apart from each other in the first direction; and a bonding member including: a conductive member disposed to overlap the plurality of lead wires on the first film portion; a first non-conductive member disposed to overlap the plurality of lead wires and the second film portion; and a second non-conductive member disposed to overlap the plurality of lead wires and the third film portion, wherein the conductive member is disposed between the first non-conductive member and the second non-conductive member in the second direction.

The conductive member may include a solder material.

The conductive member may be disposed on the plurality of lead wires, and the conductive member may include a metal paste, a metal film, or metal particles.

Each of the first non-conductive member and the second non-conductive member may include at least one of resin, urethane, or epoxy.

The conductive member may be disposed so as not to overlap a space between adjacent lead wires.

A surface of each of the plurality of lead wires facing the bonding member may have a hydrophilic property.

A surface of the base film, which faces the plurality of lead wires and does not overlap the plurality of lead wires, may have a hydrophobic property.

The conductive member and the first non-conductive member may be spaced apart from each other in the second direction, and the conductive member and the second non-conductive member may be spaced apart from each other in the second direction.

The first non-conductive member may be recessed in a direction away from the conductive member in an area overlapping the plurality of lead wires and may protrude toward the first film portion in an area not overlapping the plurality of lead wires.

The first non-conductive member may be disposed so as not to overlap the plurality of lead wires.

The bonding member may further include a third non-conductive member disposed in a space between adjacent lead wires on the first film portion.

According to one or more embodiments of the invention, a display device includes: a display area including pixels, and a non-display area located around the display area; a first substrate; a second substrate facing the first substrate; and a printed circuit film adhered to side surfaces of the first substrate and the second substrate, wherein the first substrate includes a base substrate and a plurality of connection wirings connected to the pixels, disposed on the base substrate, extending in a first direction, and spaced apart from each other in a second direction intersecting the first direction, wherein the printed circuit film includes: a base film including a first film portion extending in the first direction, a second film portion extending in the first direction, and a third film portion extending in the first direction, the first film portion disposed between the second film portion and the third film portion in the second direction; a plurality of lead wires extending in the second direction and disposed on the first, second, and third film portions, the plurality of lead wires being spaced apart from each other in the first direction; and a bonding member disposed on the first film portion and attaching the printed circuit film to the first substrate and the second substrate, wherein the bonding member includes a conductive member disposed between the lead wires and the connection wirings, and a non-conductive member disposed around the conductive member and disposed in a space between adjacent lead wires.

The conductive member may be disposed so as not to overlap the space between the adjacent lead wires.

A surface of each of the lead wires facing the bonding member may have a hydrophilic property, and a surface of the base film, which faces the lead wires and does not overlap the lead wires, may have a hydrophobic property.

According to one or more implementations of the invention, a method of fabricating a printed circuit film, includes the steps of: preparing a base film, and a plurality of lead wires disposed on the base film, the plurality of lead wires spaced apart from each other in a first direction and extending in a second direction intersecting the first direction; and forming a bonding member including a conductive member disposed to overlap a central portion of each of the plurality of lead wires, a first non-conductive member disposed to overlap a first portion of the plurality of lead wires in the second direction, and a second non-conductive member disposed to overlap a second portion of the plurality of lead wires in the second direction.

The conductive member may include a solder material.

The conductive member may be formed on the plurality of lead wires, and the conductive member may include a metal paste, a metal film, or metal particles.

Each of the first non-conductive member and the second non-conductive member may include at least one of resin, urethane, or epoxy.

The conductive member may be disposed so as not to overlap a space between adjacent lead wires.

The method may further include the steps of: hydrophilically processing a surface of each of the plurality of lead wires facing the bonding member after the preparing of the plurality of lead wires; and hydrophobically processing a surface of the base film facing the plurality of lead wires and not overlapping the plurality of lead wires.

According to one or more implementations of the invention, a method of fabricating a display device, includes the steps of: polishing side surfaces of a first substrate, a first substrate including a connection wiring on the first substrate, and a second substrate facing the first substrate; and adhering a printed circuit film onto the polished side surfaces of the first substrate and the second substrate, wherein the printed circuit film includes a base film, lead wires on the base film, and a bonding member configured to attach the printed circuit film to the first substrate and the second substrate, and the bonding member includes a conductive member connecting the lead wires to the connection wiring, and a non-conductive member disposed around the conductive member and disposed in a space between adjacent lead wires.

The step of adhering of the printed circuit film onto the side surfaces of the first substrate and the second substrate may include the steps of: placing the printed circuit film on the polished side surfaces of the first substrate and the second substrate; and applying heat and pressure from an outside of the printed circuit film.

It is to be understood that both the foregoing general description and the following detailed description are exemplary and explanatory and are intended to provide further explanation of the invention as claimed.

A method of fabricating a printed circuit film, comprising the steps of:
preparing a base film, and a plurality of lead wires disposed on the base film, the plurality of lead wires spaced apart from each other in a first direction and extending in a second direction intersecting the first direction; and forming a bonding member comprising a conductive member disposed to overlap a central portion of each of the plurality of lead wires, a first non-conductive member disposed to overlap a first portion of the plurality of lead wires in the second direction, and a second non-conductive member disposed to overlap a second portion of the plurality of lead wires in the second direction.

The method of claim 1, wherein the conductive member comprises a solder material.

The method of claim 1, wherein: the conductive member is formed on the plurality of lead wires, and the conductive member comprises a metal paste, a metal film, or metal particles.

The method of claim 1, wherein each of the first non-conductive member and the second non-conductive member comprises at least one of resin, urethane, or epoxy.

The method of claim 1, wherein the conductive member is disposed so as not to overlap a space between adjacent lead wires.

The method of claim 1, further comprising the steps of: hydrophilically processing a surface of each of the plurality of lead wires facing the bonding member after the preparing of the plurality of lead wires; and hydrophobically processing a surface of the base film facing the plurality of lead wires and not overlapping the plurality of lead wires.

A method of fabricating a display device, comprising the steps of: polishing side surfaces of a first substrate, a first substrate comprising a connection wiring on the first substrate, and a second substrate facing the first substrate; and adhering a printed circuit film onto the polished side surfaces of the first substrate and the second substrate, wherein the printed circuit film comprises a base film, lead wires on the base film, and a bonding member configured to attach the printed circuit film to the first substrate and the second substrate, and the bonding member comprises a conductive member connecting the lead wires to the connection wiring, and a non-conductive member disposed around the conductive member and disposed in a space between adjacent lead wires.

The method of claim 7, wherein the step of adhering of the printed circuit film onto the side surfaces of the first substrate and the second substrate comprises the steps of: placing the printed circuit film on the polished side surfaces of the first substrate and the second substrate; and applying heat and pressure from an outside of the printed circuit film.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
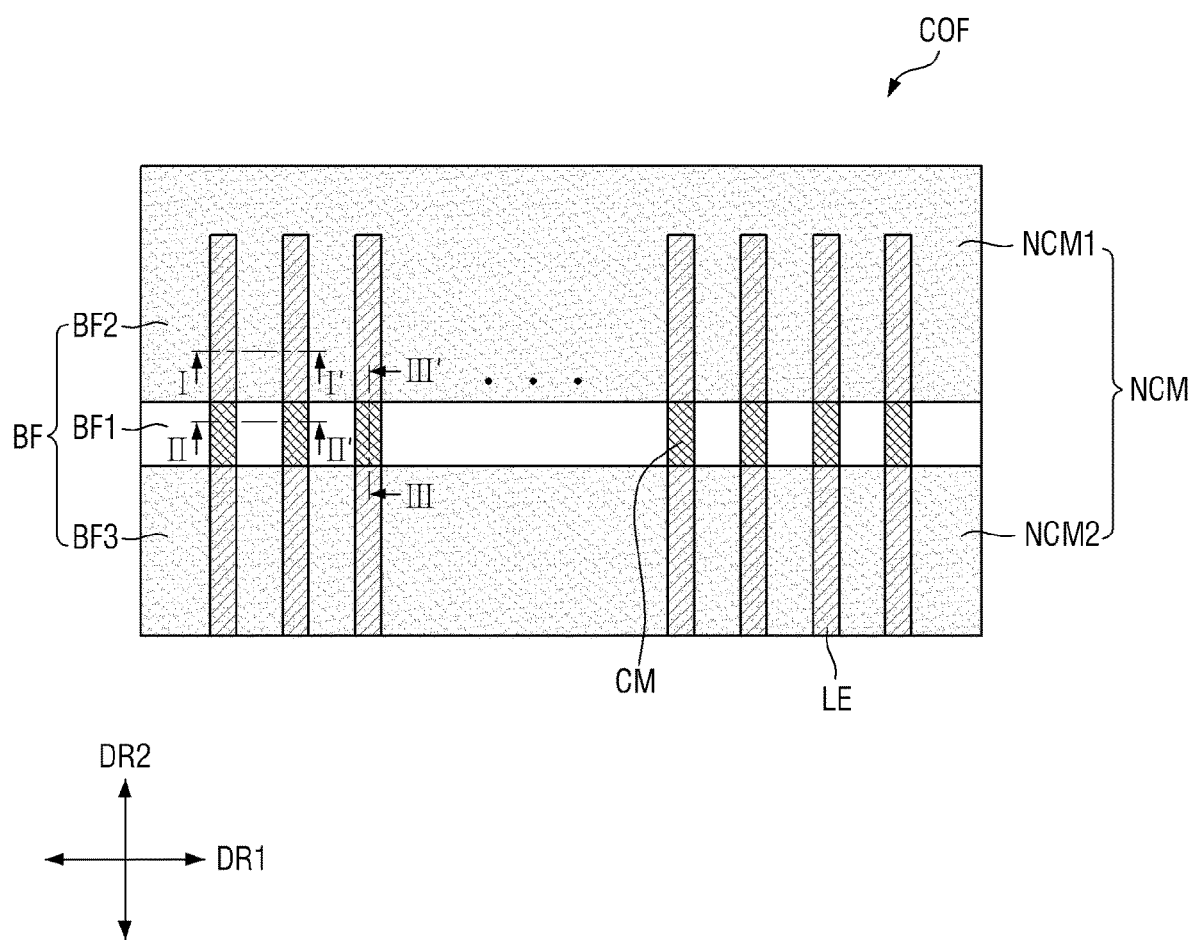
FIG. 1 is a plan view of an embodiment of a printed circuit film constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z—axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the invention will be described with reference to the attached drawings.

Figure 2:
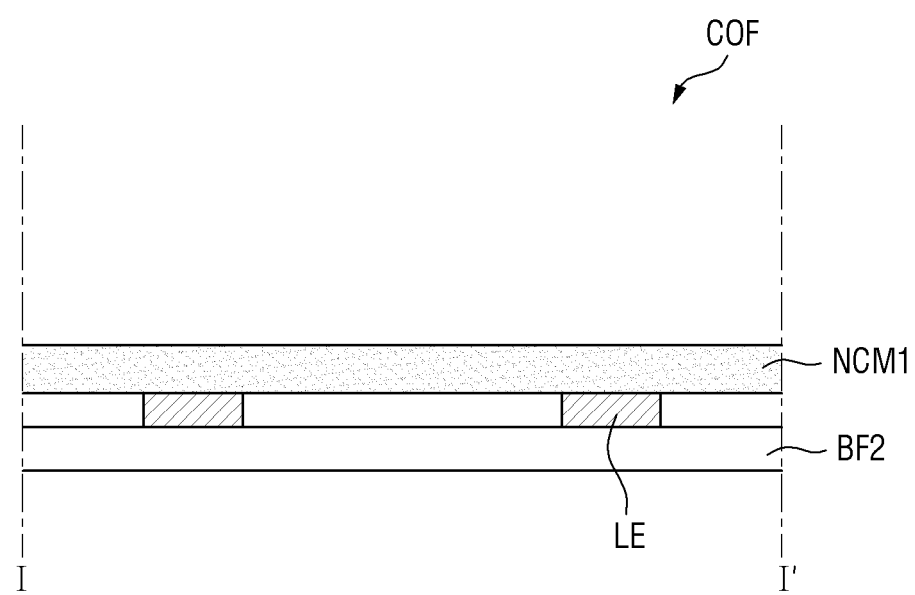
FIG. 2 is a cross-sectional view taken along line I-I' of FIG. 1.
Figure 2:
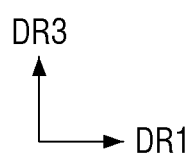
Figure 3:
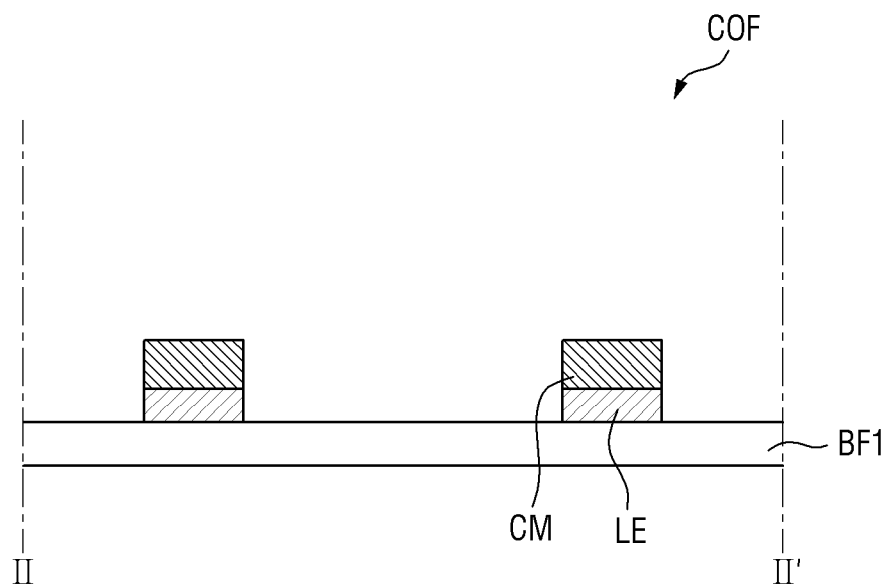
FIG. 3 is a cross-sectional view taken along line II-II' of FIG. 1.
Figure 4:
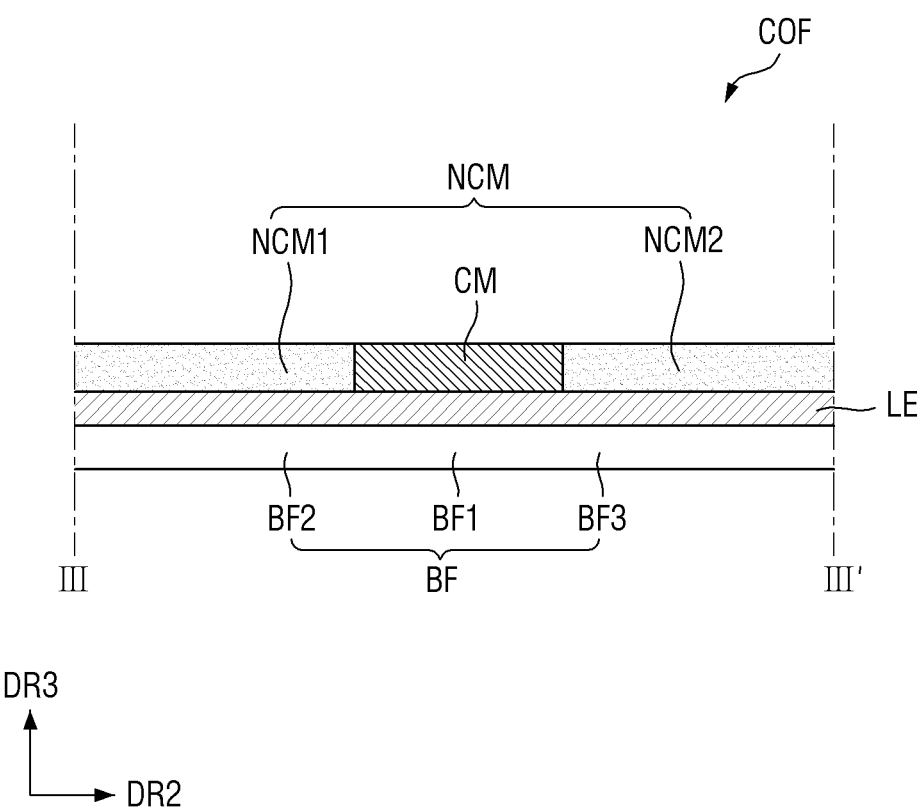
FIG. 4 is a cross-sectional view taken along line III-III' of FIG. 1.

FIG. 1 is a plan view of an embodiment of a printed circuit film constructed according to the principles of the invention. FIG. 2 is a cross-sectional view taken along line I-I' of FIG. 1. FIG. 3 is a cross-sectional view taken along line II-II' of FIG. 1. FIG. 4 is a cross-sectional view taken along line III-III' of FIG. 1.

With reference to FIGS. 1, 2, 3, and 4, a printed circuit film COF may be a printed circuit film COF for a display device that is to be bonded to a display panel to transfer signals to a display panel.

The printed circuit film COF may include a base film BF and a plurality of lead wires LE arranged on the base film BF.

The base film BF may include a flexible material. For example, the flexible material may include polyimide PI, but embodiments are not limited thereto.

In the embodiments, the first direction DR1 and the second direction DR2 intersect each other in different directions. In the plan view of FIG. 1, the horizontal direction is defined as the first direction DR1 and the vertical direction is defined as the second direction DR2 for convenience of description. In the following embodiments, one direction of the first direction DR1 represents a direction toward the right side of the base film BF in plan view, and the other direction of the first direction DR1 represents a direction toward the left side of the base film BF in plan view. One direction of the second direction DR2 represents an upward direction in plan view, and the other direction of the second direction DR2 represents a downward direction in plan view. However, a direction mentioned in the embodiments refers to a relative direction, but embodiments are not limited thereto.

The base film BF may be divided into a plurality of regions.

For example, the base film BF may include a first film portion BF1 arranged at the center thereof and extending along the first direction DR1, and a second film portion BF2 and a third film portion BF3 separated by the first film portion BF1 interposed therebetween.

The second film portion BF2 may be located on one side of the first film portion BF1 in the second direction DR2, and the third film portion BF3 may be located on the other side of the first film portion BF1 in the second direction DR2. The adjacent first, second, and third film portions BF1, BF2, and BF3 may be arranged to adjoin or neighbor each other.

The second and third film portions BF2 and BF3 may extend along the first direction DR1 in the substantially same manner as the first film portion BF1.

The lead wires LE may extend along the second direction DR2. The plurality of lead wires LE may be arranged at intervals along the first direction DR1.

The lead wires LE may include a conductive material. The conductive material may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W) and copper (Cu).

The lead wires LE may extend to overlap or cross the second film portion BF2, the first film portion BF1, and the third film portion BF3. The lead wires LE may be arranged on the first, second, and third film portions BF1, BF2, and BF3.

The lead wires LE may be electrically connected to a connection wiring of the display device.

The printed circuit film COF may further include a data driving integrated circuit connected to the lead wires LE. A signal input from the data driving integrated circuit may be transferred to the aforementioned connection wiring of the display panel through the lead wires LE that are electrically connected to the connection wiring.

According to an embodiment, the printed circuit film COF may further include a bonding member. The bonding member may bond or connect the printed circuit film COF to the display panel of the aforementioned display device. For example, the bonding member may be a component constituting the printed circuit film COF to bond or connect the printed circuit film COF to the display panel.

The bonding member may be arranged on the plurality of lead wires LE and the base film BF.

The bonding member may be divided into distinct portions.

The bonding member may include a conductive member CM arranged on the first film portion BF1 of the base film BF to overlap the plurality of lead wires LE in a third direction DR3 (e.g., in a vertical direction), a first non-conductive member NCM1 located on one side of the conductive member CM in the second direction DR, and a second non-conductive member NCM2 located on the other side of the conductive member CM in the second direction DR2. For example, the conductive member CM may be disposed between the first non-conductive member NCM1 and the second non-conductive member NCM2 in the second direction DR2 (e.g., in a horizontal direction).

The conductive member CM may be arranged so as not to overlap the spaces between the adjacent lead wires LE in the third direction DR3. For example, the conductive member CM may be arranged to overlap only each of the lead wires LE. For example, a width of the conductive member CM in the first direction DR1 may be substantially same as or smaller than a width of each of the lead wires LE in the first direction DR1. The conductive member CM may be arranged on a surface of the lead wires LE that is opposite to the surface facing the base film BF. The conductive member CM may be directly arranged on a surface of the lead wires LE that is opposite to the surface facing the base film BF.

The conductive member CM may serve or function to electrically connect the lead wires LE to the connection wiring of the aforementioned display panel. The conductive member CM may be interposed between the lead wires LE and the connection wiring of the aforementioned display panel for electrical connection as well as physical connection between the lead wires LE and the connection wiring.

The conductive member CM may be any of materials having conductivity. For example, the conductive member CM may include a solder material. In some embodiments, the conductive member CM may include a metal paste, a metal film, or metal particles, but embodiments are not limited thereto.

The conductive member CM may have a self-assembly property for the lead wires LE. In more detail, the conductive member CM may have a strong tendency to adhere to the lead wires LE. Such a tendency to adhere to the lead wires LE may make it possible to reduce the probability of the conductive material flowing down to the surroundings of the lead wires LE (e.g., separation space between the neighboring lead wires LE) during the formation of the conductive member CM on the lead wires LE. For example, the separation space between the neighboring lead wires LE may be an empty space or a space filled with air or gas.

The first and second non-conductive members NCM1 and NCM2 may each be responsible for connecting the printed circuit film COF and the display panel. The first and second non-conductive members NCM1 and NCM2 may be arranged so as not overlap the connection wiring of the aforementioned display panel in side view (e.g., in cross-sectional view). The first and second non-conductive members NCM1 and NCM2 may be arranged on the lead wires LE and the surface of the base film BF exposed by the lead wires LE. The first non-conductive member NCM1 may be arranged on the second film portion BF2, and the second non-conductive member NCM2 may be arranged on the third film portion BF3. The first and second non-conductive members NCM1 and NCM2 may not each overlap the first film portion BF1 in the third direction DR3.

The first and second non-conductive members NCM1 and NCM2 may each be arranged directly on the lead wires LE and the surface of the base film BF exposed by the lead wires LE.

The first and second non-conductive members NCM1 and NCM2 may each include a material not having conductivity (e.g., non-conductive materials).

For example, although the first and second non-conductive members NCM1 and NCM2 may each include at least one of resin, urethane, or epoxy, but the first and second non-conductive members NCM1 and NCM2 are not limited to the aforementioned materials.

The conductive member CM may be arranged in contact with each of the adjacent non-conductive members NCM1 and NCM2 (e.g., in the second direction DR2).

The conductive member CM and the non-conductive members NCM1 and NCM2 of the bonding member may be integrally formed. In the case where the conductive member CM and the non-conductive members NCM1 and NCM2 of the bonding member are integrally formed, they may be arranged on the base film BF and the lead wires LE, as described above, after the bonding member is integrally fabricated.

In some embodiments, the conductive member CM and the non-conductive members NCM1 and NCM2 of the bonding member may not be integrally formed. In the case where the conductive member CM and the non-conductive members NCM1 and NCM2 of the bonding member are not integrally formed, one of the conductive member CM and the non-conductive members NCM1 and NCM2 may be disposed in the corresponding area and then others are disposed in the corresponding areas.

Unlike the conductive member CM having the self-assembly property to the lead wires LE, the non-conductive members NCM1 and NCM2 do not have any self-assembly property to the lead wires LE. The non-conductive members NCM1 and NCM2 may have a stronger tendency to adhere to the surface of the base film BF located in the spaces between the adjacent lead wires LE.

With reference to FIG. 2, the first non-conductive member NCM1 may be in direct contact with the lead wires LE. The first non-conductive member NCM1 may be arranged to be separated from the base film BF. However, the first non-conductive member NCM1 may sag down to directly contact the base film BF in some cases.

The second non-conductive member NCM2 may directly contact the lead wires LE in the substantially same manner as that of the first non-conductive member NCM1. The second non-conductive member NCM2 may be arranged to be separated from the base film BF. However, the second non-conductive member NCM2 may sag down to directly contact the base film BF in another embodiment.

With reference to FIG. 3, the conductive member CM may be directly arranged on the lead wires LE. The conductive member CM may be arranged so as not to overlap the space between the adjacent lead wires LE.

With reference to FIG. 4, the conductive member CM may be arranged on the first film portion BF1 of the base film BF to overlap the plurality of lead wires LE. The first non-conductive member NCM1 located at one side of the conductive member CM in the second direction DR2 may be arranged to overlap the lead wires LE on the second film member BF2, and the second non-conductive member NCM2 located at the other side of the conductive member CM in the second direction DR2 may be arranged to overlap the lead wires LE on the third film portion BF3 in the third direction DR3.

The conductive member CM may be arranged to directly contact the adjacent first and second non-conductive members NCM1 and NCM2.

According to an embodiment, the printed circuit film COF may include a bonding member for connecting the printed circuit film COF and the display panel.

Hereinafter, a method of fabricating a printed circuit film according to an embodiment will be described. In the following embodiment, the same components as those of the above-described embodiment are denoted by the same reference numerals, and a description thereof will be omitted or simplified for descriptive convenience.

According to an implementation, the method of fabricating a printed circuit film may include preparing, at step S10, a base film BF and a plurality of lead wires LE arranged on the base film BF at intervals along the first direction DR1 and extending along the second direction DR2 crossing the first direction DR1, and forming, at step S20, a conductive member CM arranged to overlap a central portion of each of the lead wires LE, a first non-conductive member NCM1 arranged to overlap the plurality of lead wires LE at one side in the second direction DR2 and a second non-conductive member NCM2 arranged to overlap the plurality of the lead wires LE at the other side in the second direction DR2. For example, the conductive member CM may be disposed between the first non-conductive member NCM1 and the second non-conductive member NCM2 in the second direction DR2 (e.g., in the horizontal direction).

Figure 6:
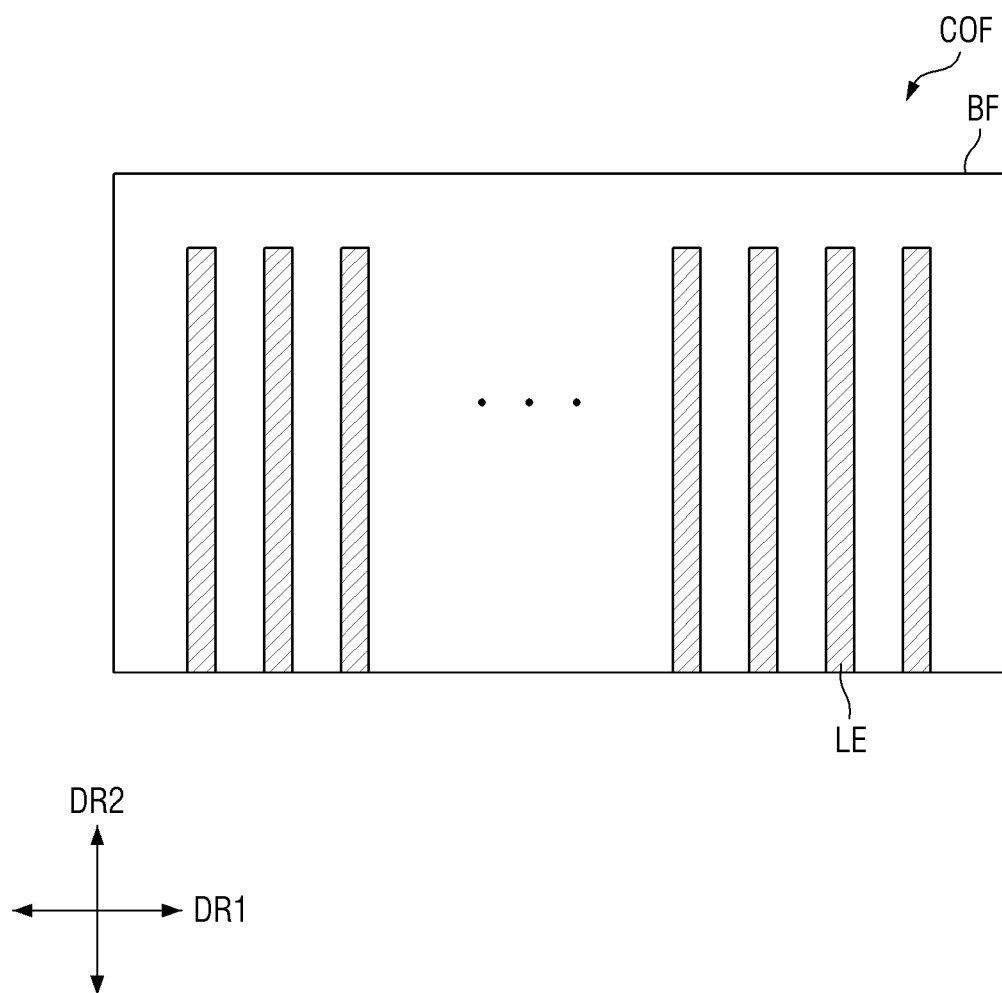
FIGS. 6, 7, and 8 are plan views illustrating process steps of the method of fabricating the printed circuit film of FIG. 5.

In more detail, with reference to FIGS. 1 and 6, the base film BF may include a first film portion BF1 arranged at the center thereof and extending along the first direction DR1, and a second film portion BF2 and a third film portion BF3 separated by the first film portion BF1 interposed therebetween.

The second film portion BF1 may be located on one side of the first film portion BF1 in the second direction DR2, and the third film portion BF3 may be located on the other side of the first film portion BF2 in the second direction DR2. The film portions BF1, BF2, and BF3 may be arranged to adjoin or neighbor each other.

The second and third film portions BF2 and BF3 may extend along the first direction DR1 in the substantially same manner as the first film portion BF1.

The lead wires LE may extend along the second direction DR2. The plurality of lead wires LE may be arranged at intervals along the first direction DR1.

The lead wires LE may include a conductive material. The conductive material may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W) and copper (Cu).

The lead wires LE may extend to overlap or cross the second film portion BF2, the first film portion BF1, and the third film portion BF3. The lead wires LE may be arranged on the first, second, and third film portions BF1, BF2, and BF3.

The lead wires LE may be electrically connected to a connection wiring of the display device.

The printed circuit film COF may further include a data driving integrated circuit connected to the lead wires LE. A signal input from the data driving integrated circuit may be transferred to the aforementioned connection wiring of the display panel through the lead wires that are electrically connected to the connection wiring.

Figure 5:
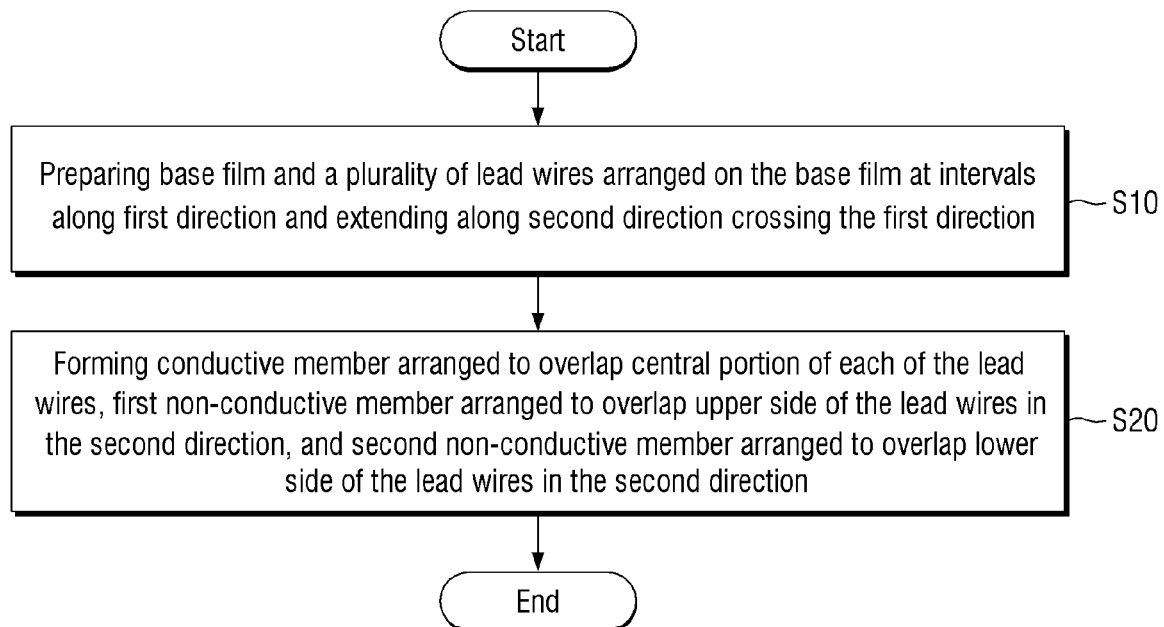
FIG. 5 is a flowchart illustrating an embodiment of a method of fabricating the printed circuit film of FIG. 1 according to the principles of the invention.
Figure 7:
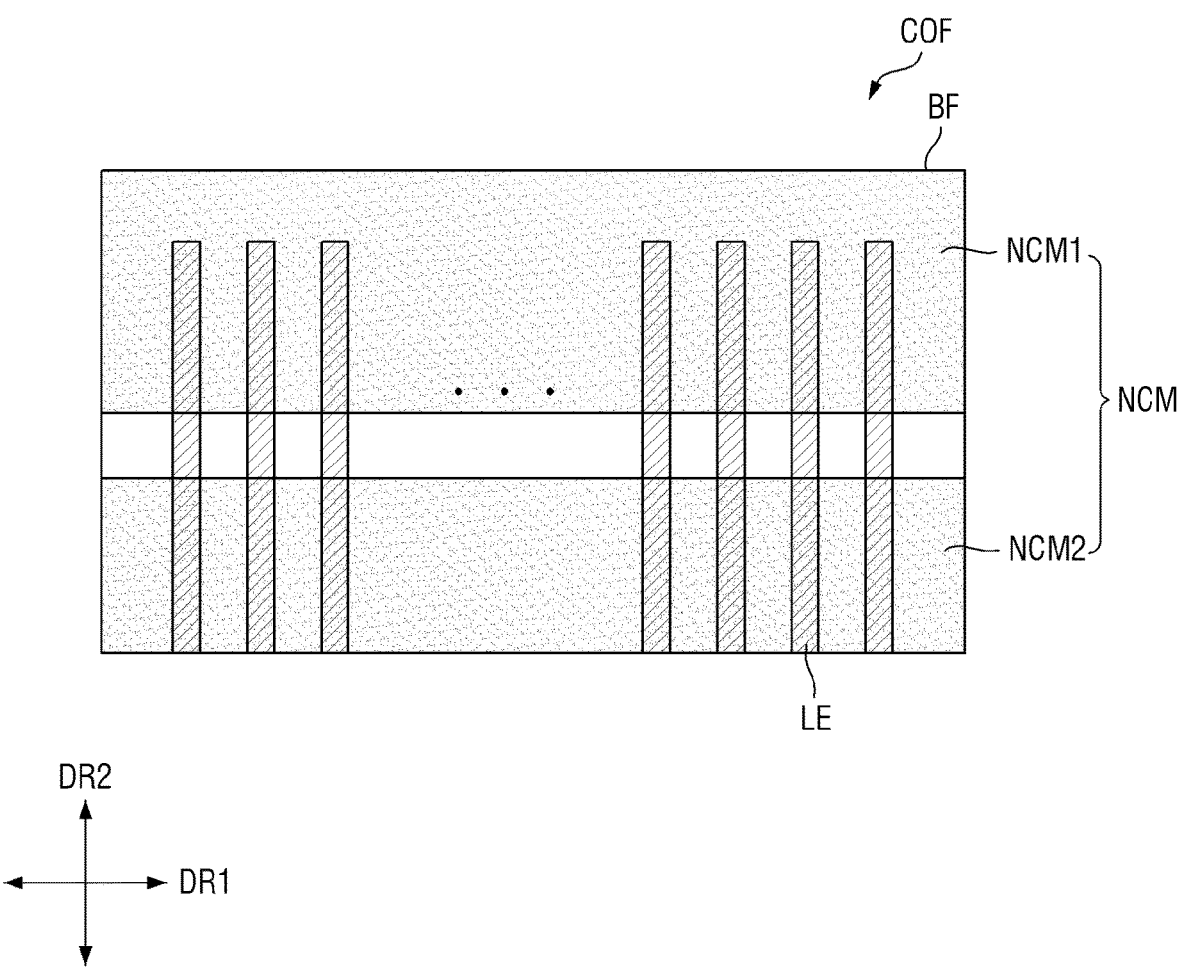

Next, with reference to FIGS. 5 and 7, the first and second non-conductive members NCM1 and NCM2 are disposed.

The first and second non-conductive members NCM1 and NCM2 may serve or function to connect the printed circuit film COF and the display panel. The first and second non-conductive members NCM1 and NCM2 may be disposed so as not overlap the connection wiring of the aforementioned display panel in side view (e.g., in cross-sectional view). The first and second non-conductive members NCM1 and NCM2 may be disposed on the lead wires LE and the surface of the base film BF exposed by the lead wires LE. The first non-conductive member NCM1 may be disposed on the second film portion BF2, and the second non-conductive member NCM2 may be disposed on the third film portion BF3. The first and second non-conductive members NCM1 and NCM2 may not each overlap the first film portion BF1 in the third direction DR3.

The first and second non-conductive members NCM1 and NCM2 may each be directly arranged on the lead wires LE and the surface of the base film BF exposed by the lead wires LE.

The first and second non-conductive members NCM1 and NCM2 may each include a material not having conductivity (e.g., non-conductive materials).

For example, although the first and second non-conductive members NCM1 and NCM2 may each include at least one of resin, urethane, or epoxy, the first and second non-conductive members NCM1 and NCM2 are not limited to the aforementioned materials.

Figure 8:
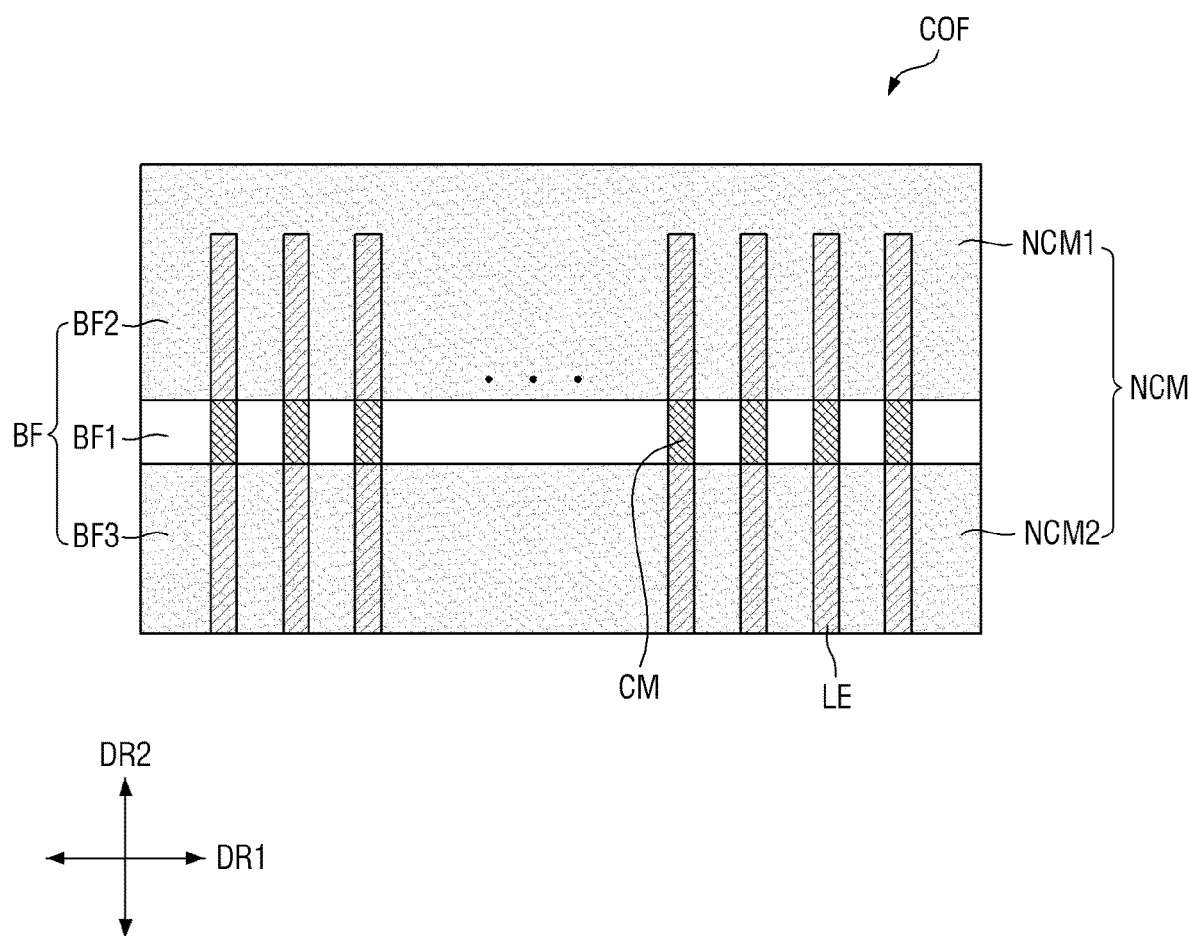

Next, with reference to FIGS. 5 and 8, the conductive member CM is disposed.

The conductive member CM may be arranged on the first film portion BF1.

The conductive member CM may be arranged so as not to overlap the spaces between the adjacent lead wires LE. For example, the spaces between the adjacent lead wires LE may be an empty space or a space filled with air or gas. For example, the conductive member CM may be arranged to overlap only each of the lead wires LE. For example, the width of the conductive member CM in the first direction DR1 may be substantially same as or smaller than the width of each of the lead wires LE in the first direction DR1. The conductive member CM may be arranged on a surface of the lead wires LE that is opposite to the surface facing the base film BF. The conductive member CM may be directly arranged on a surface of the lead wires LE that is opposite to the surface facing the base film BF.

The conductive member CM may serve to electrically connect the lead wires LE to the connection wiring of the aforementioned display panel. The conductive member CM may be interposed between the lead wires LE and the connection wiring of the aforementioned display panel for electrical connection as well as physical connection between the lead wires LE and the connection wiring.

The conductive member CM may be any of materials having conductivity without limitation. For example, the conductive member CM may include a solder material. In some embodiments, the conductive member CM may include a metal paste, a metal film, or a metal particle, but embodiments are not limited thereto.

Hereinafter, a printed circuit film according to another embodiment will be described. In the following embodiment, the same components as those of the above-described embodiment are denoted by the same reference numerals, and a description thereof will be omitted or simplified for descriptive convenience.

Figure 9:
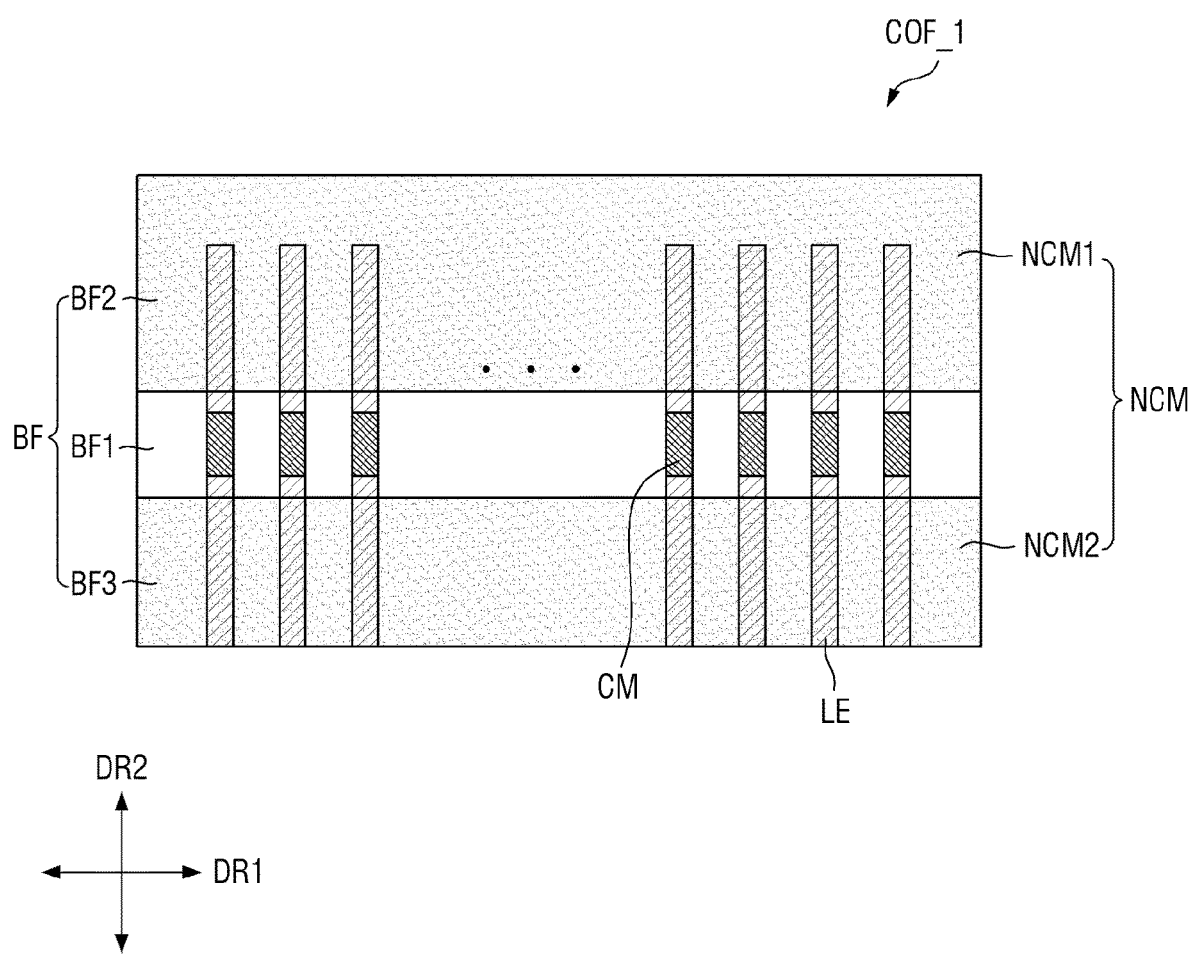
FIG. 9 is a plan view of another embodiment of the printed circuit film of FIG. 1.

FIG. 9 is a plan view of another embodiment of the printed circuit film of FIG. 1.

With reference to FIG. 9, a printed circuit film COF_1 according to this embodiment differs from the printed circuit film COF of the above-described embodiment in that the conductive member CM and the non-conductive members NCM1 and NCM2 are arranged to be separated from each other along the second direction DR2.

In more detail, in the printed circuit film COF_1 according to this embodiment, the conductive member CM and the non-conductive members NCM1 and NCM2 may be arranged to be separated from each other along the second direction DR2.

According to this embodiment, the conductive member CM may have a self-assembly property to the lead wires LE. In more detail, the conductive member CM may have a strong tendency to adhere to the lead wires LE. Such a tendency to adhere to the lead wires LE may make it possible to reduce the probability of the conductive material flowing down to the surroundings of the lead wires LE (e.g., separation space between the neighboring lead wires LE) during the formation of the conductive member CM on the lead wires LE. For example, the separation space between the neighboring lead wires LE may be an empty space or a space filled with air or gas.

Furthermore, this makes it possible to form the non-conductive members NCM1 and NCM2 and then the conductive member CM to be separated from the non-conductive members NCM1 and NCM2 such that the conductive member CM fills the separation space between the non-conductive members NCM1 and NCM2 and the conductive member CM because the conductive member CM has the self-assembly property to the lead wires LE. For example, some portion of the lead wires LE on the first film BF1 may be exposed by the first non-conductive member NCM1 or the second non-conductive member NCM2. In another embodiment, the conductive member CM may be connected to only one of the non-conductive members NCM1 and NCM2 in the second direction DR2.

Figure 10:
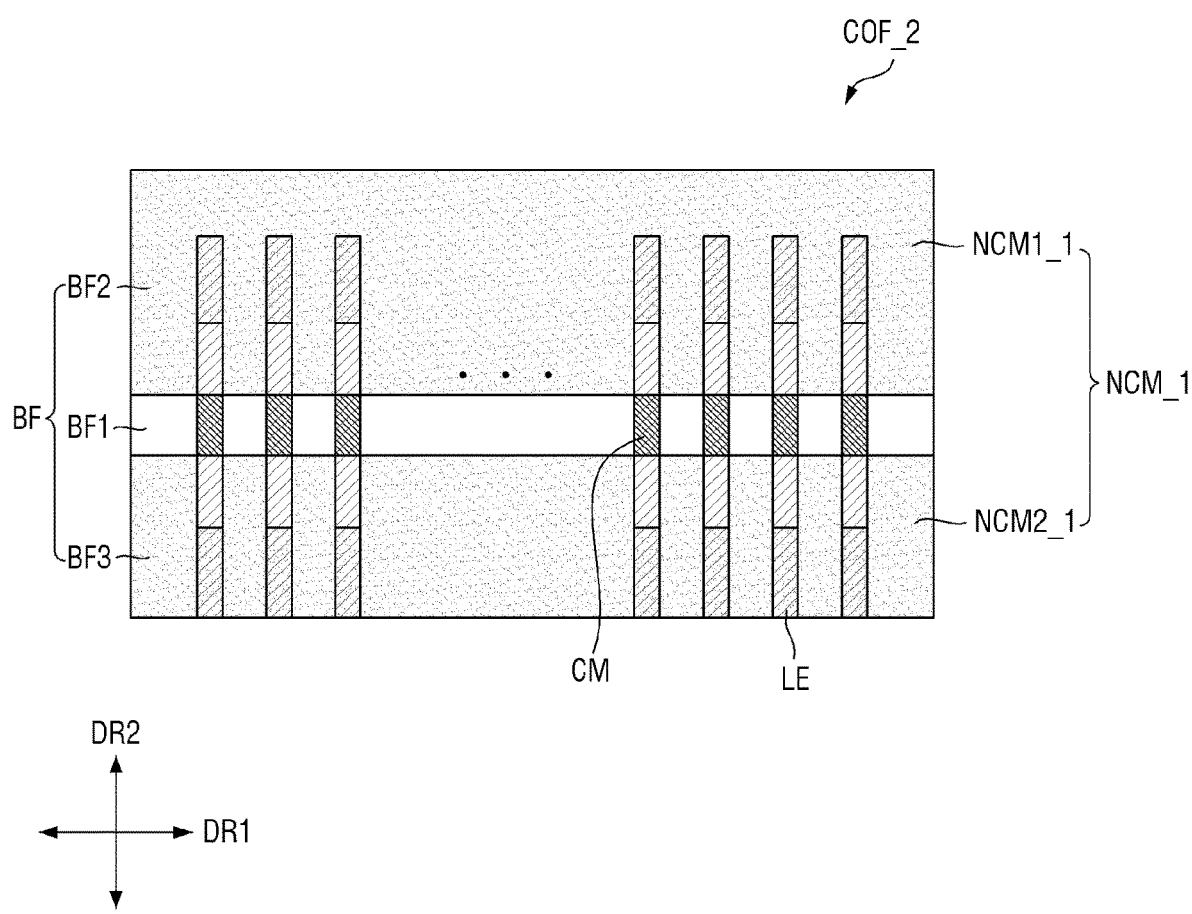
FIG. 10 is a plan view of another embodiment of the printed circuit film of FIG. 1.

FIG. 10 is a plan view of another embodiment of the printed circuit film of FIG. 1.

With reference to FIG. 10, a printed circuit film COF_2 according to this embodiment differs from the printed circuit film COF of FIG. 1 in that a first non-conductive member NCM1_1 of a non-conductive member NCM_1 may be recessed in a direction away from the conductive member CM in an area overlapping the lead wires LE and protrude toward the first film portion BF1 in an area not overlapping the lead wires LE.

In more detail, the printed circuit film COF_2 according to this embodiment may be formed such that the first non-conductive member NCM1_1 is recessed in a direction away from the conductive member CM in an area overlapping the lead wires LE and protrudes toward the first film portion BF1 in an area not overlapping the lead wires LE. For example, the first non-conductive member NCM1_1 may partially overlap the lead wires LE on the second film portion BF2, and the second non-conductive member NCM2_1 may partially overlap the lead wires LE on the third film portion BF2.

According to this embodiment, the first non-conductive member NCM1_1 may be recessed in a direction away from the conductive member CM in an area overlapping the lead wires LE to guide extension of the conductive member CM along the lead wires LE, which increases the area of the lead wires LE, leading to reduction of total resistance when being connected to the connection wiring of the display panel.

Furthermore, the first non-conductive member NCM1_1 may increase in amount by being protruded toward the first film portion BF1 in the area not overlapping the lead wires LE, which may facilitate filling the spaces between the adjacent lead wires LE, thereby improving the bonding force to the display panel when the display panel and the printed circuit film COF_2 are bonded afterward.

The second non-conductive member NCM2_1 may be recessed in the direction away from the conductive member CM in the area overlapping the lead wires LE and protrude toward the first film portion BF1 in the area not overlapping the lead wires LE.

Figure 11:
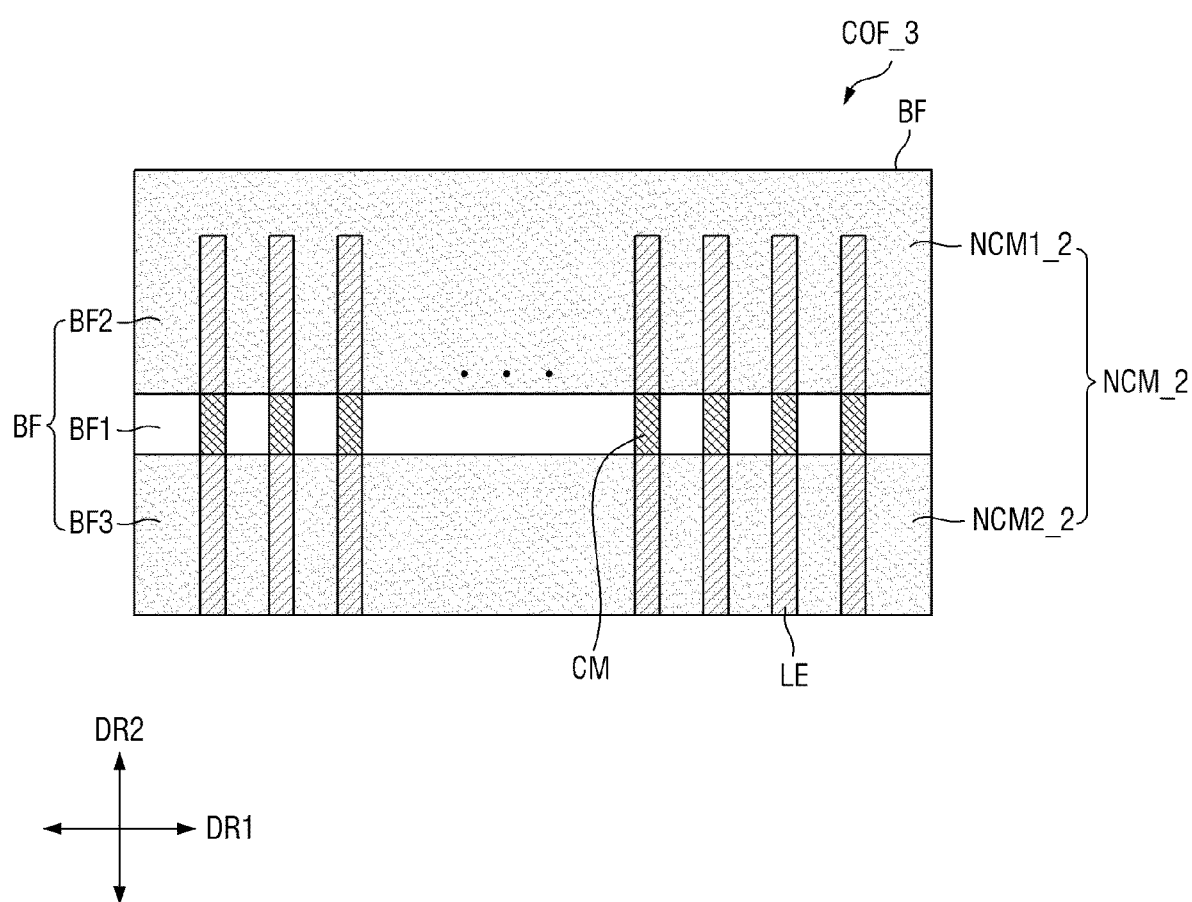
FIG. 11 is a plan view of another embodiment of the printed circuit film of FIG. 1.

FIG. 11 is a plan view of another embodiment of the printed circuit film of FIG. 1.

With reference to FIG. 11, a printed circuit film COF_3 according to this embodiment differs from the printed circuit film COF_2 of FIG. 10 in that a first non-conductive member NCM1_2 of a non-conductive member NCM_2 is arranged so as not to overlap the lead wires LE at all and protrudes toward the first film portion BF1 in the spaces between the adjacent lead wires LE.

The second non-conductive member NCM2_2 is similar to the first non-conductive member NCM1_2 with the exception of being arranged on the third film portion BF3, and a detailed description thereof is omitted hereinafter to avoid redundancy.

According to this embodiment, the non-conductive member NCM_2 is arranged so as not to overlap the lead wires LE at all and spaced apart from the conductive member CM along the second direction DR2, guiding extension of the conductive member CM along the lead wires LE, which increases the area of the lead wires LE, leading to reduction of total resistance when being connected to the connection wiring of the display panel.

Furthermore, the non-conductive member NCM_2 may increase in amount by being protruded toward the first film portion BF1 in the area not overlapping the lead wires LE, which may facilitate filling the spaces between the adjacent lead wires LE, thereby improving the bonding force to the display panel when the display panel and the printed circuit film COF_3 are bonded afterward.

Figure 12:
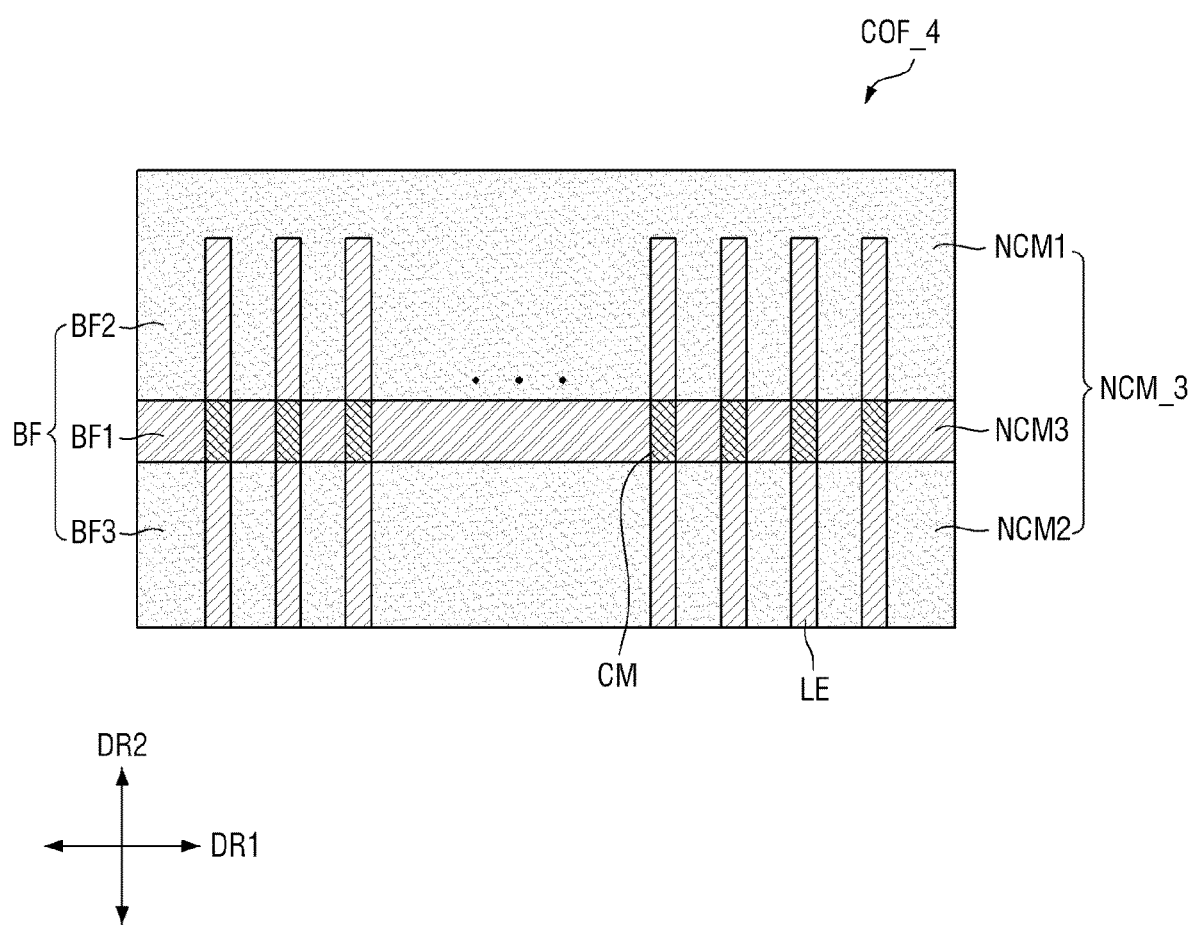
FIG. 12 is a plan view of another embodiment of the printed circuit film of FIG. 1.

FIG. 12 is a plan view of another embodiment of the printed circuit film of FIG. 1.

With reference to FIG. 12, a printed circuit film COF_4 according to this embodiment differs from the printed circuit film COF_2 of FIG. 10 in that the printed circuit film COF_4 further includes a third non-conductive member NCM3 arranged between the adjacent lead wires LE on the first film portion BF1.

In more detail, the printed circuit film COF_4 according to this embodiment may further include the third non-conductive member NCM3 arranged between the adjacent lead wires LE on the first film portion BF1.

The third non-conductive member NCM_3 may include a resin or epoxy material. The third non-conductive member NCM3 may be formed after the formation of the first and second non-conductive members NCM1 and NCM2. The third non-conductive member NCM3 may be formed by depositing a resin or epoxy material.

According to this embodiment, the printed circuit film COF_4 may further include the non-conductive member NCM_3 arranged between adjacent lead wires LE on the first film portion BF1, increasing the amount of the non-conductive material NCM_3, which may facilitate filling the spaces between the adjacent lead wires LE, thereby improving the bonding force to the display panel when the display panel and the printed circuit film COF_4 are bonded afterward.

Figure 13:
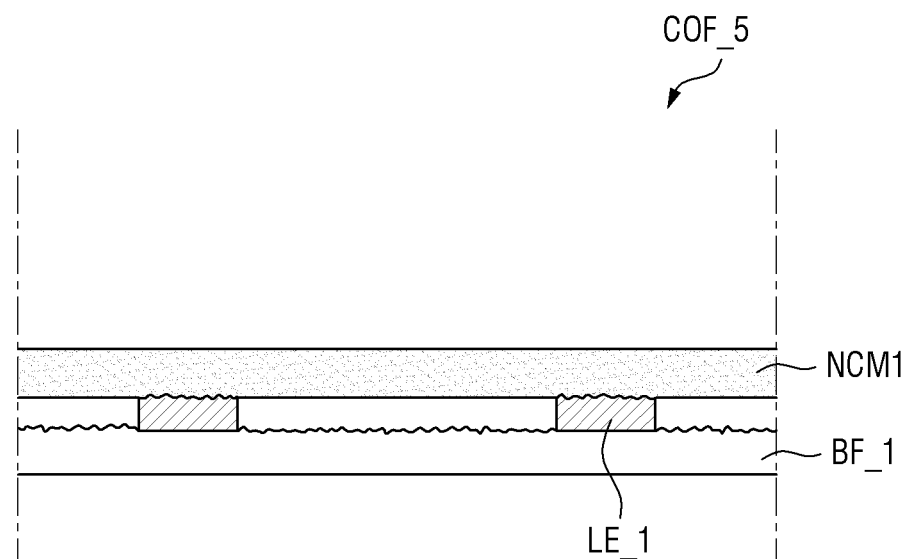
FIGS. 13, 14, and 15 are cross-sectional views of another embodiment of the printed circuit film of FIG. 1.
Figure 14:
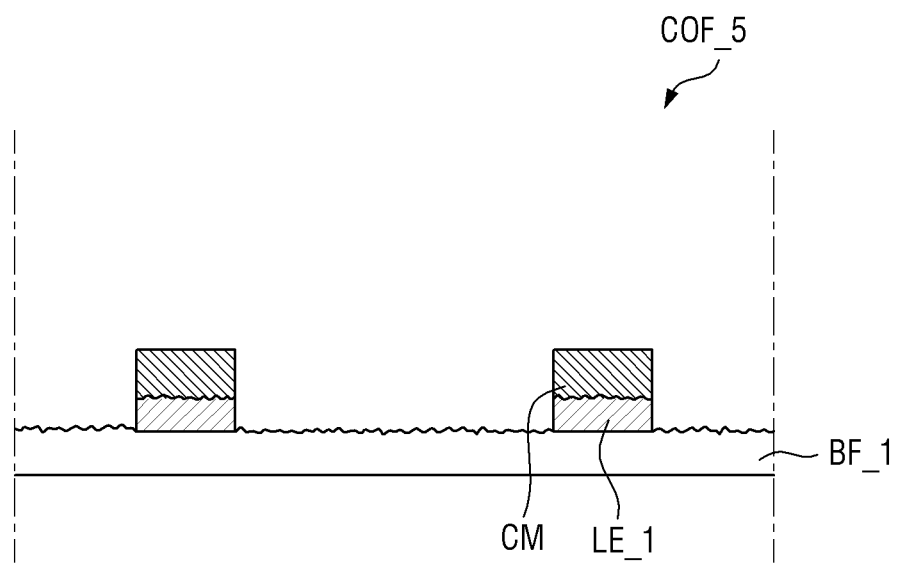
Figure 14:
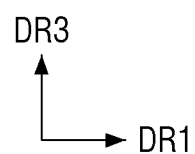
Figure 15:
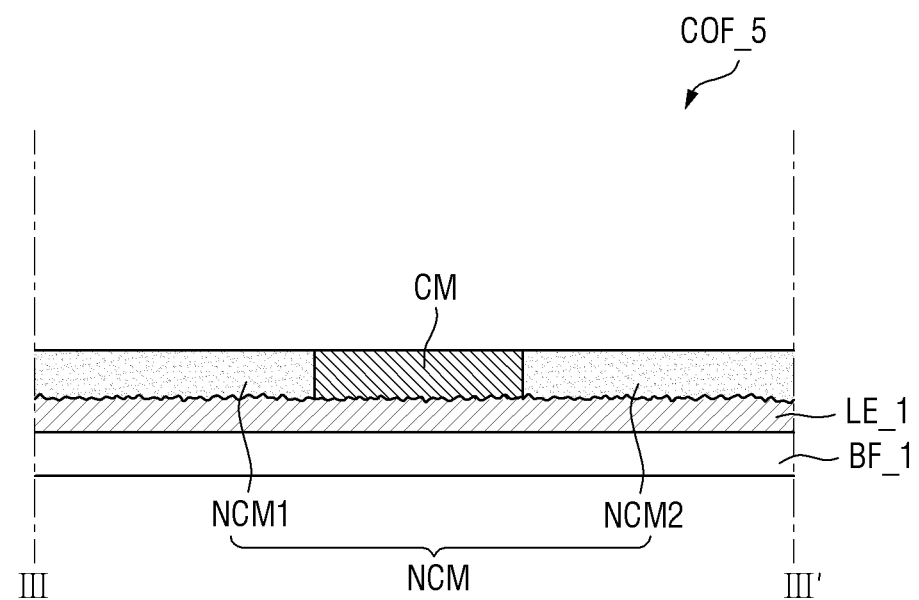

FIGS. 13, 14, and 15 are cross-sectional views of another embodiment of the printed circuit film of FIG. 1.

With reference to FIGS. 13, 14, and 15, a printed circuit film COF_5 according to this embodiment differs from the printed circuit film COF of FIGS. 1, 2, 3, and 4 in that the printed circuit film COF_5 includes lead wires LE_1 of which one surface facing the bonding member is hydrophilically processed and a base film BF_1 of which one surface facing the lead wires LE_1 has hydrophobically-processed portions on which the lead wires LE_1 are not disposed. For example, one surface of the lead wires LE_1, which faces the bonding member, has a hydrophilic property, and one surface of the base film BF_1, which faces the lead wires LE_1 and does not overlap the lead wires LE_1, has a hydrophobic property.

In more detail, the printed circuit film COF_5 according to this embodiment may include the lead wires LE_1 of which one surface facing the bonding member is hydrophilically processed and the base film BF_1 of which one surface facing the lead wires LE_1 has hydrophobically-processed portions on which the lead wires LE_1 are not disposed.

According to the embodiment, the printed circuit film COF_5 includes the lead wires LE_1 of which one surface facing the bonding member is hydrophilically processed and the base film BF_1 of which one surface facing the lead wires LE_1 has hydrophobically-processed portions on which the lead wires LE_1 are not disposed, which may cause the conductive member CM to be more strongly bonded with the lead wires LE and cause the non-conductive members NCM1 and NCM2 to be more strongly bonded with the based film BF_1 exposed by the spaces between the lead wires LE.

Figure 16:
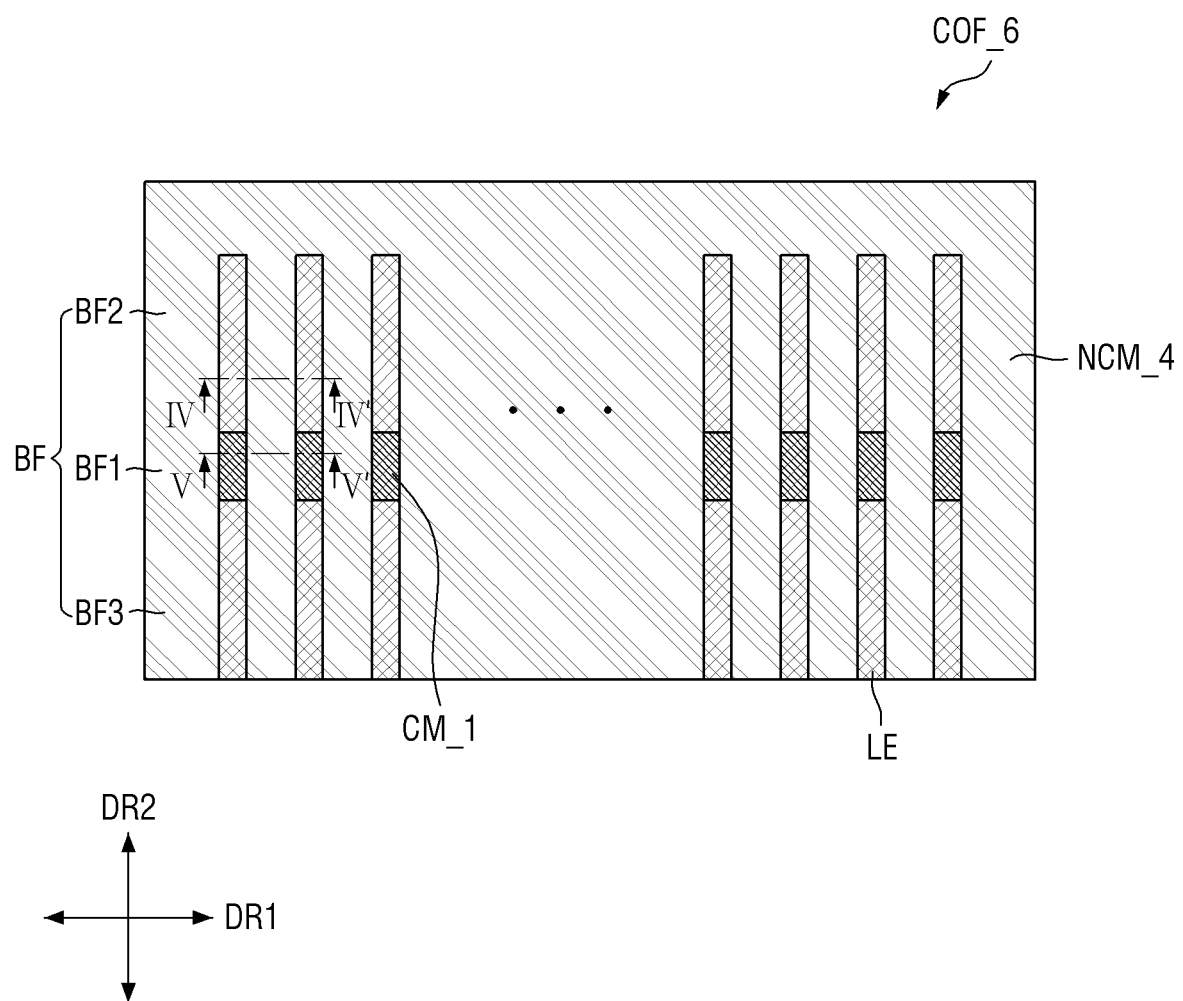
FIG. 16 is a plan view of another embodiment of the printed circuit film of FIG. 1.
Figure 17:
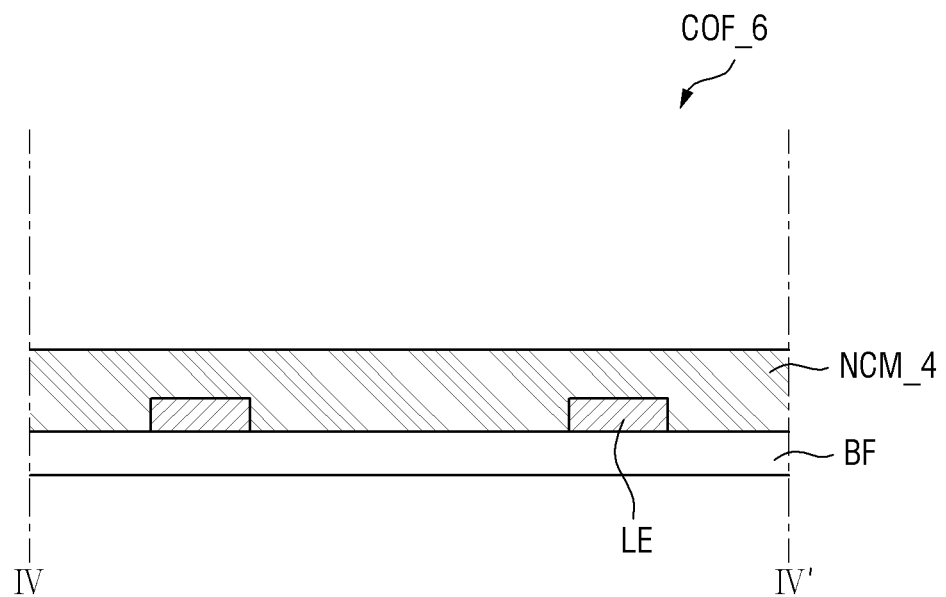
FIG. 17 is a cross-sectional view taken along line IV-IV' of FIG. 16.
Figure 17:
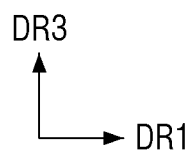
Figure 18:
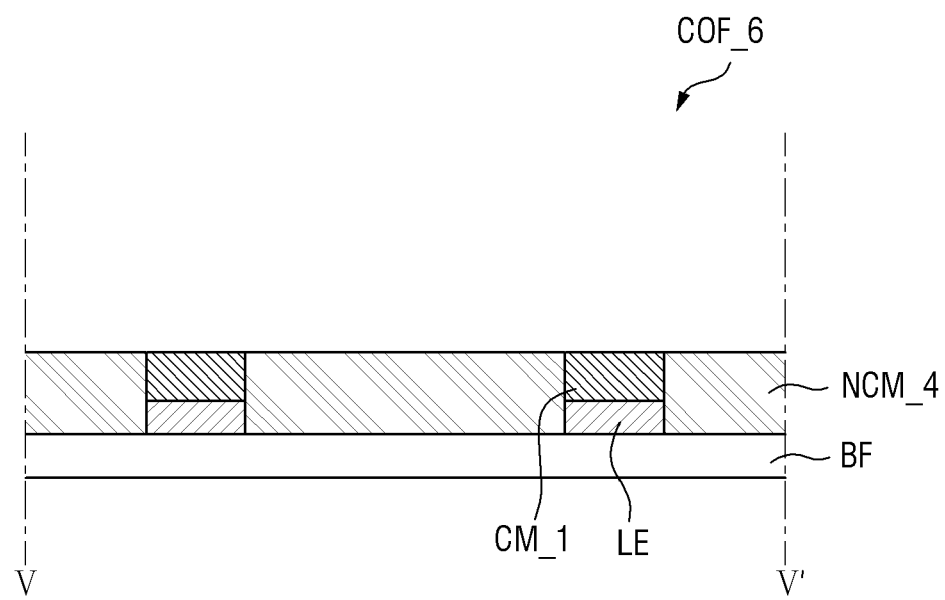
FIG. 18 is a cross-sectional view taken along line V-V' of FIG. 16.
Figure 18:
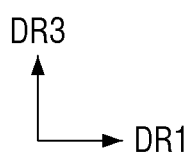

FIG. 16 is a plan view of another embodiment of the printed circuit film of FIG. 1. FIG. 17 is a cross-sectional view taken along line IV-IV' of FIG. 16. FIG. 18 is a cross-sectional view taken along line V-V' of FIG. 16.

With reference to FIGS. 16, 17, and 18, a printed circuit film COF_6 according to this embodiment differs from the printed circuit film COF of the above-described embodiment in that the printed circuit film COF_6 includes a non-conductive member NCM_4 arranged on the entire area of a base film BF with the exception of areas where a conductive member CM_1 is arranged.

In more detail, the non-conductive member NCM_4 of the printed circuit film COF_6 of this embodiment may be arranged on the entire area of the base film BF with the exception of the conductive member CM_1.

As shown in FIG. 17, the non-conductive member NCM_4 may fill the spaces between the lead wires LE and directly contact the base film BF.

As shown in FIG. 18, the non-conductive member NCM_4 may fill the spaces between the lead wires LE formed on the base film BF and directly contact the base film BF.

Hereinafter, a display device according to an embodiment will be described. In the following embodiment, the same components as those of the above-described embodiment are denoted by the same reference numerals, and a description thereof will be omitted or simplified for descriptive convenience.

Figure 19:
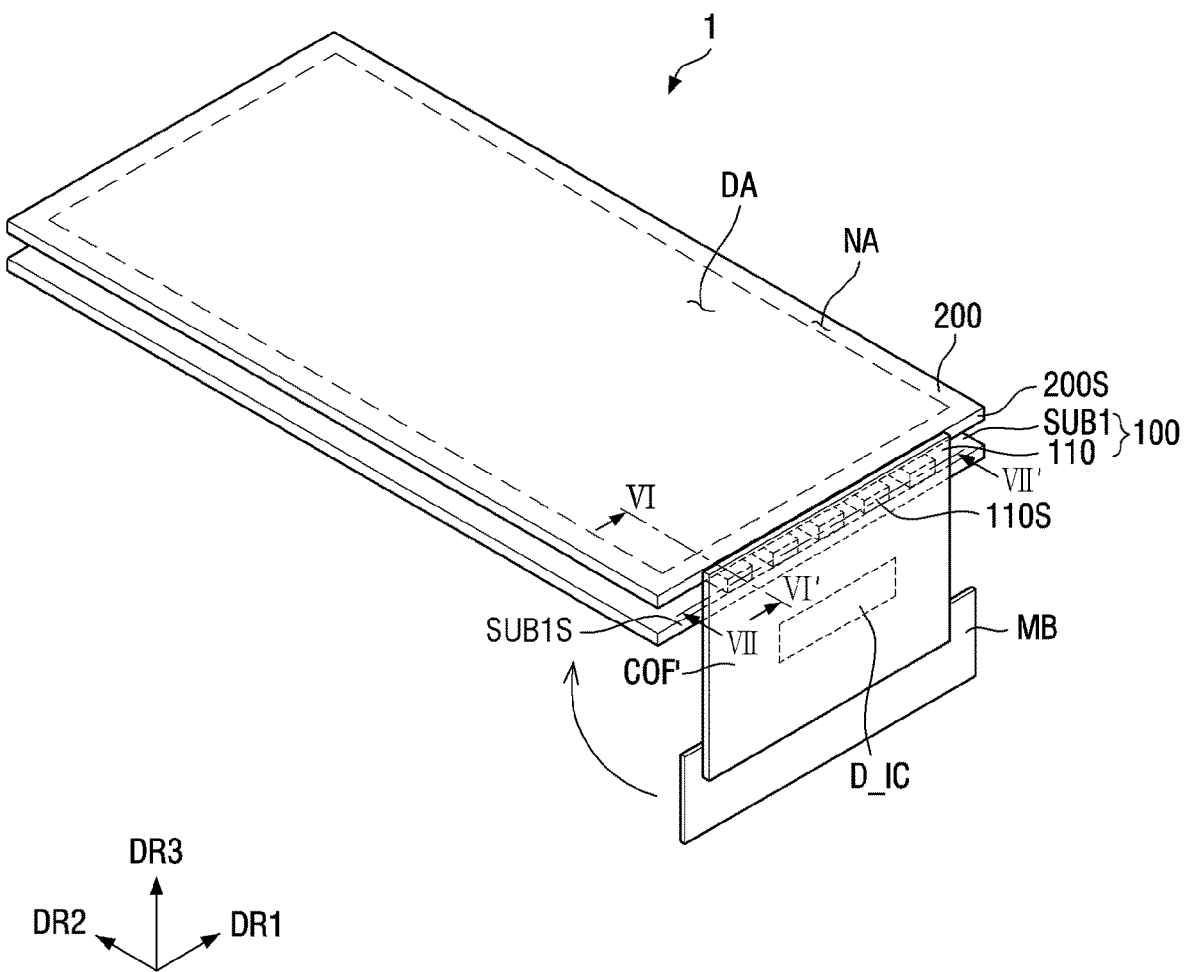
FIG. 19 is a perspective view of an embodiment of a display device constructed according to the principles of the invention.
Figure 20:
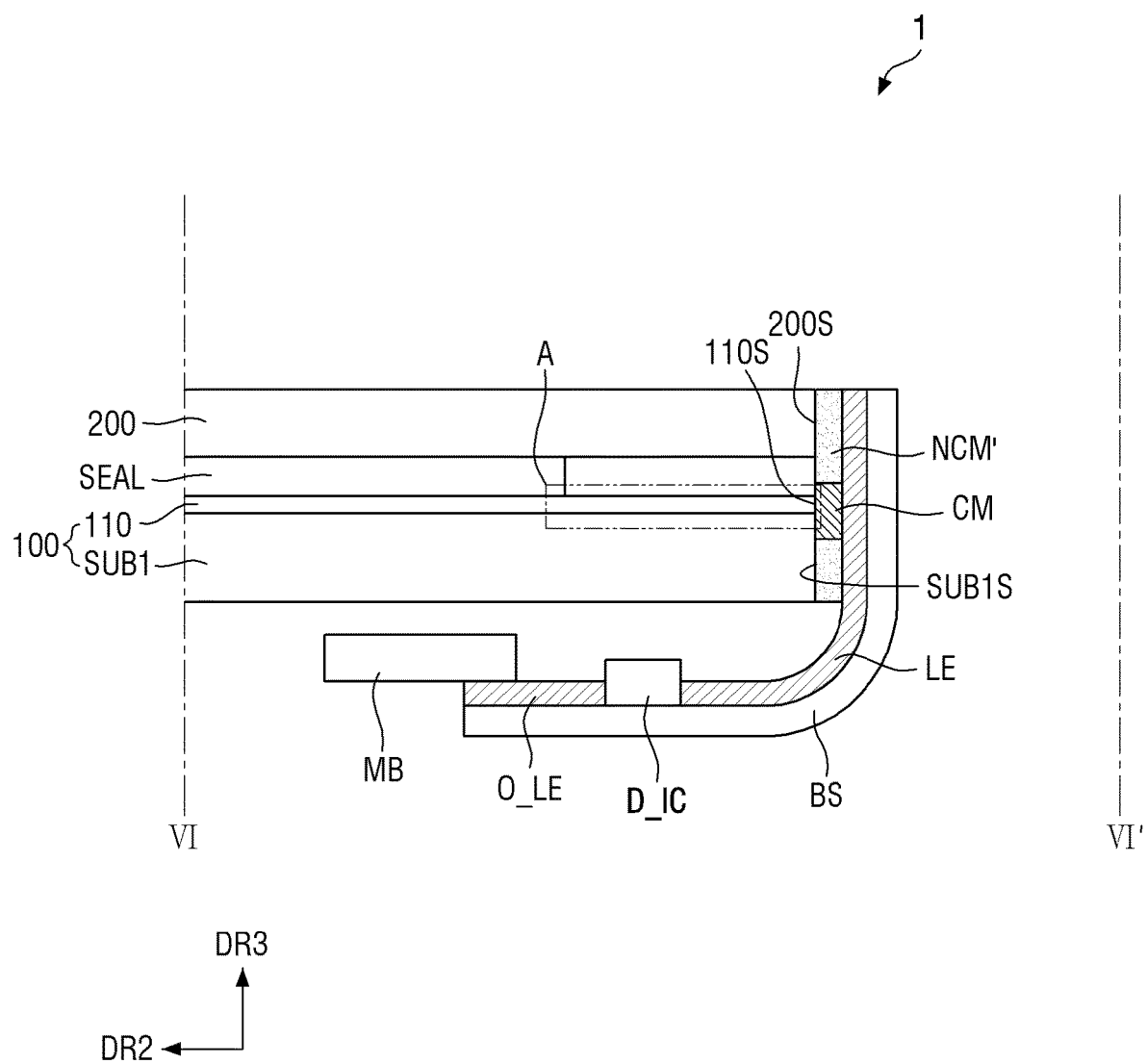
FIG. 20 is a cross-sectional view taken along line VI-VI' of FIG. 19.
Figure 21:
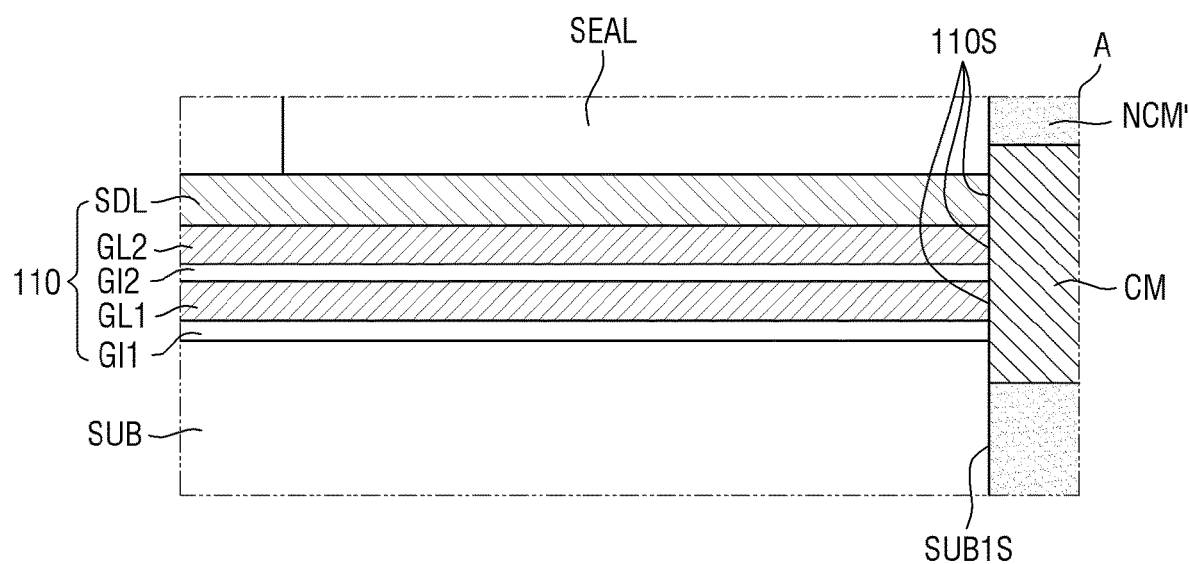
FIG. 21 is an enlarged cross-sectional view of region A of FIG. 20.
Figure 22:
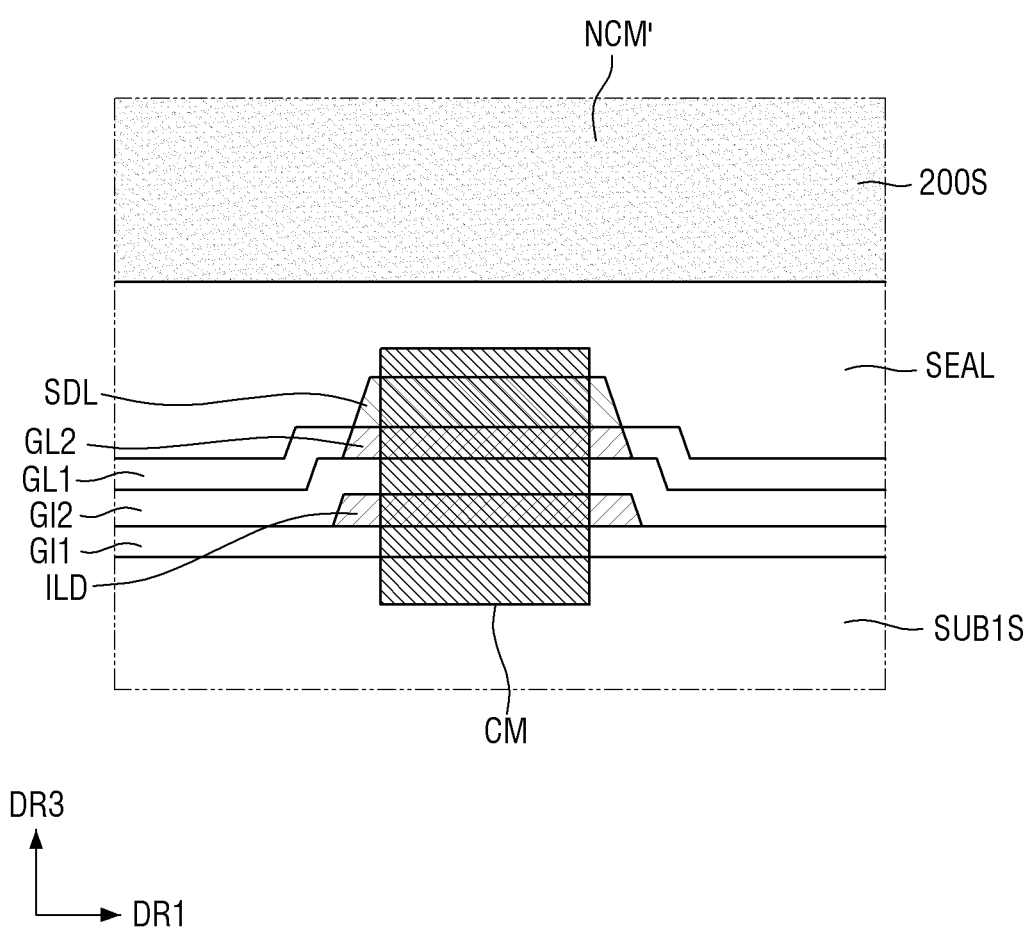
FIG. 22 is a side view of a display panel of the display device of FIG. 20.
Figure 23:
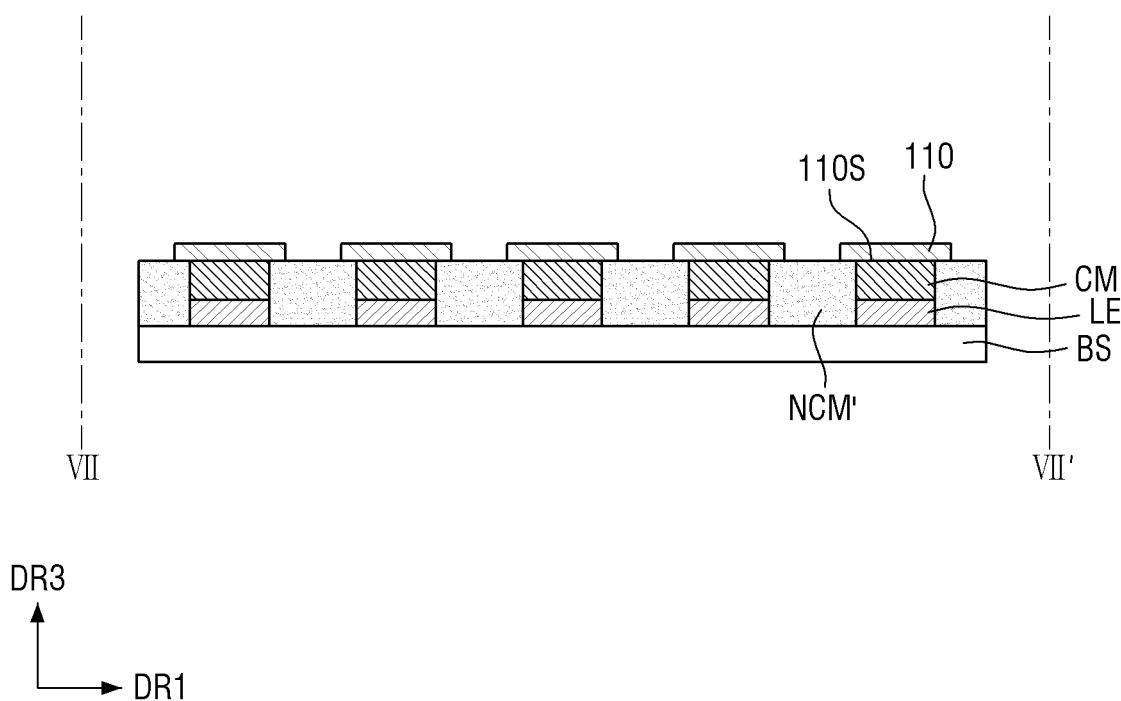
FIG. 23 is a cross-sectional view taken along line VII-VII' of FIG. 19.

FIG. 19 is a perspective view of an embodiment of a display device constructed according to the principles of the invention. FIG. 20 is a cross-sectional view taken along line VI-VI' of FIG. 19. FIG. 21 is an enlarged cross-sectional view of region A of FIG. 20. FIG. 22 is a side view of a display panel of the display device of FIG. 20. FIG. 23 is a cross-sectional view taken along line VII-VII' of FIG. 19.

Referring to FIGS. 19, 20, 21, 22, and 23, a display device 1 may include a display panel 100 and 200, a printed circuit film COP connected to one side of the display panel 100 and 200, and a main circuit board MB connected to the printed circuit film COP.

The display panel 100 and 200 may include a first substrate 100, a second substrate 200, various elements disposed on the first substrate 100, and various elements disposed on the second substrate 200.

For example, an organic light emitting display panel may be applied to the display panel 100 and 200. In the following embodiments, a case where the organic light emitting display panel is applied to the display panel 100 and 200 will be exemplified, but embodiments are not limited thereto, and other types of display panels such as a liquid crystal display (LCD) panel, a quantum dot organic light emitting display (QD-OLED) panel, a quantum dot liquid crystal display (QD-LCD) panel, a quantum-nano light emitting display (QNED) panel and a micro LED panel may be applied thereto.

The various elements of the first substrate 100 may include a plurality of insulation layers, a plurality of conductive layers, at least one thin film transistor, and an organic light emitting element connected to the at least one thin film transistor.

For example, the first substrate 100 may be a back plate substrate including the at least one thin film transistor or a thin film transistor substrate.

The second substrate 200 may be arranged above the first substrate 100 to face the first substrate 100. The second substrate 200 may include an encapsulation layer for encapsulating the organic light emitting element.

The first and second substrates 100 and 200 may each include a base substrate. The base substrates of the first and second substrates 100 and 200 may include a rigid material such as glass and quartz. For example, the first substrate 100 may include a first base substrate SUB1.

The first substrate 100 may further include a connection wiring 110 arranged between the first base substrate SUB1 and the second substrate 200.

The display panel 100 and 200 may have a rectangular shape with right-angled corners in plan view. The display panel 100 and 200 may have long sides and short sides in plan view. The short sides of the display panel 100 and 200 may be sides extending in the first direction DR1. The long sides of the display panel 100 and 200 may be sides extending in the second direction DR2. The first and second substrates 100 and 200 may have substantially the same planar shape.

The first and second substrates 100 and 200 may each be polished at one side surface thereof (e.g., a lower short side in the second direction DR2) such that one side of the first substrate 100 and one side of the second substrate 200 are aligned along the thickness direction (e.g., in the third direction DR3). Although the first and second substrates 100 and 200 may be arranged at different side surfaces (e.g., an upper short side in the second direction DR2, a right long side in the first direction DR1, and a left long side in the first direction DR1) such that the side surfaces of the first and second substrates 100 and 200 are aligned in the thickness direction. However, embodiments are not limited thereto.

Hereinafter, the polished side surface of the first substrate 100 and a polished side surface 200S of the second substrate 200 are respectively referred to as a first side surface of the first substrate 100 and a second side surface of the second substrate 200.

The first substrate 100 may include a display area DA and a non-display area NA surrounding the display area DA. The display area DA of the first substrate 100 may include a plurality of pixels arranged thereon. The pixels may include at least one thin film transistor and an organic light emitting element. The non-display area NA of the first substrate 100 may further include a sealing area. The sealing area may be arranged in the non-display area NA to run along the edges of the first and second substrates 100 and 200. A sealing member including frit or the like may be arranged in the sealing area. The sealing member may be arranged between the first and second substrates 100 and 200 to bond the first and second substrates 100 and 200 together.

The display area DA may have a rectangular shape with right-angled or rounded corners in plan view. The display area DA may be substantially identical in shape with the display 100 and 200 in plan view. For example, the display area DA may have short sides and long sides. The long side of the display area DA may be a side extending in the second direction DR2. The short side of the display area DA may be a side extending in the first direction DR1. However, the planar shape of the display area DA is not limited to a rectangular shape, but may have a circular shape, an elliptical shape, or various other shapes.

The non-display area NA may be disposed around the display area DA. The non-display area NA may be disposed adjacent to both the short sides and both the long sides of the display area DA. In this case, the non-display area NA may surround all sides of the display area DA and form edges of the display area DA. However, embodiments are not limited thereto, and the non-display area NA may be disposed adjacent to both short sides or both long sides of the display area DA.

The sealing area may have a shape of a rectangle frame arranged to run along the edges of the first and second substrates 100 and 200.

The connection wiring 110 from the display area DA of the first substrate 100 may pass through the non-display area NA (e.g., the lower short side in the first direction DR1). The connection wiring 110 may be electrically connected to the pixel of the display area DA. The connection wiring 110 may extend to the first side surface of the first and second substrates 100 and 200 such that a first side surface 110s of the connection wiring 110 is aligned with the first side surfaces of the first and second substrates 100 and 200 in the thickness direction (e.g., the third direction DR3).

The first base substrate SUB1 of the first substrate 100 may include a first side surface SUB1S like the first side surface of the first substrate 100. The first side surface SUB of the first base substrate SUB1, the first side surface 110s of the connection wiring 110, and the side surface 200S of the second substrate 200 may be mutually aligned along the thickness direction.

There may be a plurality of connection wirings 110. The plurality of connection wirings 110 may be spaced apart from each other in the first direction DR1. Although only five connection wirings 110 are shown in the drawing, the number of connection wirings 110 may be equal to or greater than six.

The connection wiring 110 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W) and copper (Cu).

The printed circuit film COF' may be adhered to the first side surfaces of the first and second substrates 100 and 200. The printed circuit film COF' may be electrically connected to the plurality of connection wirings 110 and the plurality of connection pads.

The printed circuit film COF' may further include a driving integrated circuit D_IC. The driving integrated circuit D_IC may be electrically connected to the connection wirings 110 via lead wires to be described later.

Although it is shown in FIG. 19 that the printed circuit film COF' adheres only to the first side surface of the display panel 100 and 200, embodiments are not limited thereto, and the printed circuit film COF' may be arranged on at least one of the first side surface and other side surfaces of the display panel 100 and 200.

The printed circuit film COF' may adhere to the display panel 100 and 200 at one end thereof and to the main circuit board MB at the other end opposite to the one end.

The printed circuit film COF' may adhere on the connection wirings 110 of the first substrate 100 via the aforementioned bonding member. In this manner, the lead wires LE of the printed circuit film COF' may be electrically connected to the connection wirings 110 of the first substrate 100. The printed circuit film COF' may be a flexible film such as a flexible printed circuit board, a printed circuit board, or a chip-on film.

The driving integrated circuit D_IC may be, for example, a data driving integrated circuit, and may be implemented as a data driving chip by applying a chip on film (COF) method.

The main circuit board MB may be connected to the other end of the printed circuit film COF'.

The display device 1 may further include a touch electrode member arranged on the second substrate 200. The touch electrode member may be directly formed on the second substrate 200.

The touch electrode member may further include touch electrodes arranged in a touch sensor area for sensing a touch of a user.

However, embodiments are not limited thereto. For example, the touch electrode member may be formed as a separate member distinct from the display panel 100 and 200.

The printed circuit film COF' may be bent down such that the printed circuit film COF' and the main circuit board MB are below the first substrate 100 as shown in FIGS. 19 and 20. For example, the other end of the printed circuit film COP and the main circuit board MB may be arranged below the first substrate 100.

The conductive member CM may be arranged between the lead wires LE and the side surface 110S of the connection wirings 110 in the second direction DR2. The conductive member CM may electrically connect the lead wires LE and the connection wirings 110.

A non-conductive member NCM' may be arranged on the side surface of a sealing member SEAL and the side surface 200S of the second substrate 200.

As shown in FIG. 21, the connection wirings 110 may include a plurality of wiring layers. The plurality of wiring layers may include a first gate line GL1, a second gate line GL2 on the first gate line GL1, and a source/drain line SDL on the second gate line GL2. The first gate line GL1, the second gate line GL2 on the first gate line GL1, and the source/drain line SDL on the second gate line GL2 may be electrically connected to one another.

The plurality of wiring layers may further include a first gate insulation layer GI1 between the first base substrate SUB1 and the first gate line GL1 and a second gate insulation layer GL2 between the first gate line GL1 and the second gate line GL2.

The first and second gate lines GL1 and GL2 and the source/drain line SDL may each include one or more metals selected among molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W) and copper (Cu).

The first and second gate insulation layers GI1 and GI2 may each include an inorganic material. The inorganic material may include silicon oxide, silicon nitride, silicon nitride oxide, and aluminum oxide, but embodiments are not limited thereto.

The conductive member CM may be directly arranged on the side surfaces of the first and second gate lines GL1 and GL2 and the source/drain line SDL.

As shown in FIG. 22, the conductive member CM may be arranged directly on the side surfaces of the first and second gate lines GL1 and GL2 and the source/drain line SDL.

The width of the conductive member CM in the first direction DR1 may be less than the width of the connection wirings 110 in the first direction DR1.

As shown in FIG. 23, the non-conductive member NCM' may fill the spaces between the adjacent lead wires LE to directly contact the base film BF. The non-conductive member NCM' may also fill the spaces between the adjacent lead wires to directly contact the base film BF.

Hereinafter, a method of fabricating the display device 1 according to an embodiment will be described. In the following embodiment, the same components as those of the above-described embodiment are denoted by the same reference numerals, and a description thereof will be omitted or simplified for descriptive convenience.

Figure 24:
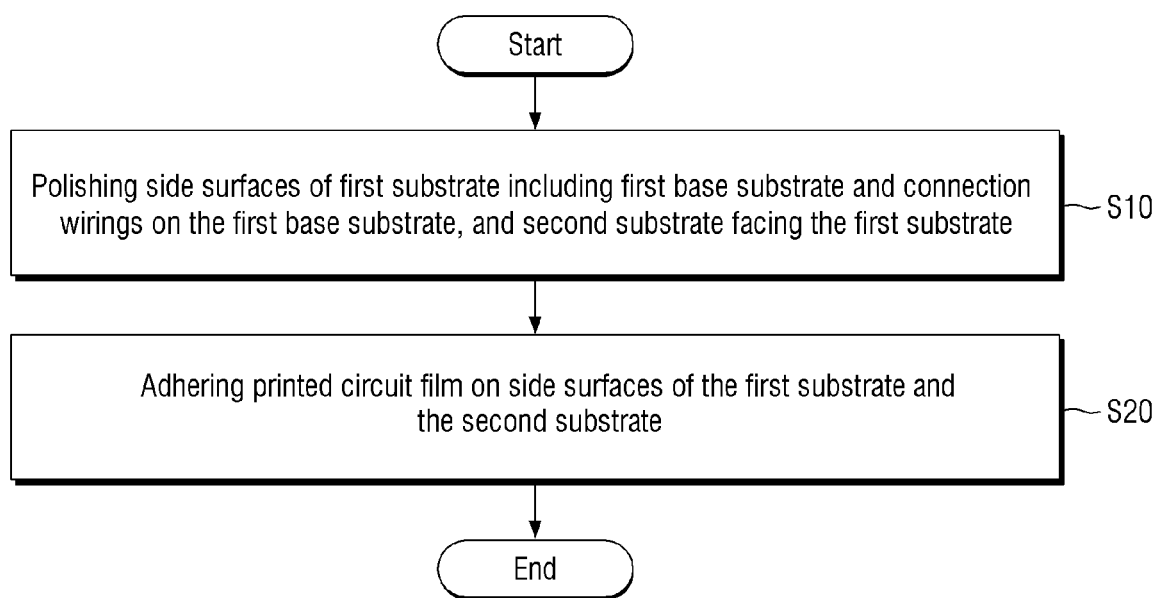
FIG. 24 is a flowchart illustrating an embodiment of a method of fabricating the display device of FIG. 19.
Figure 25:
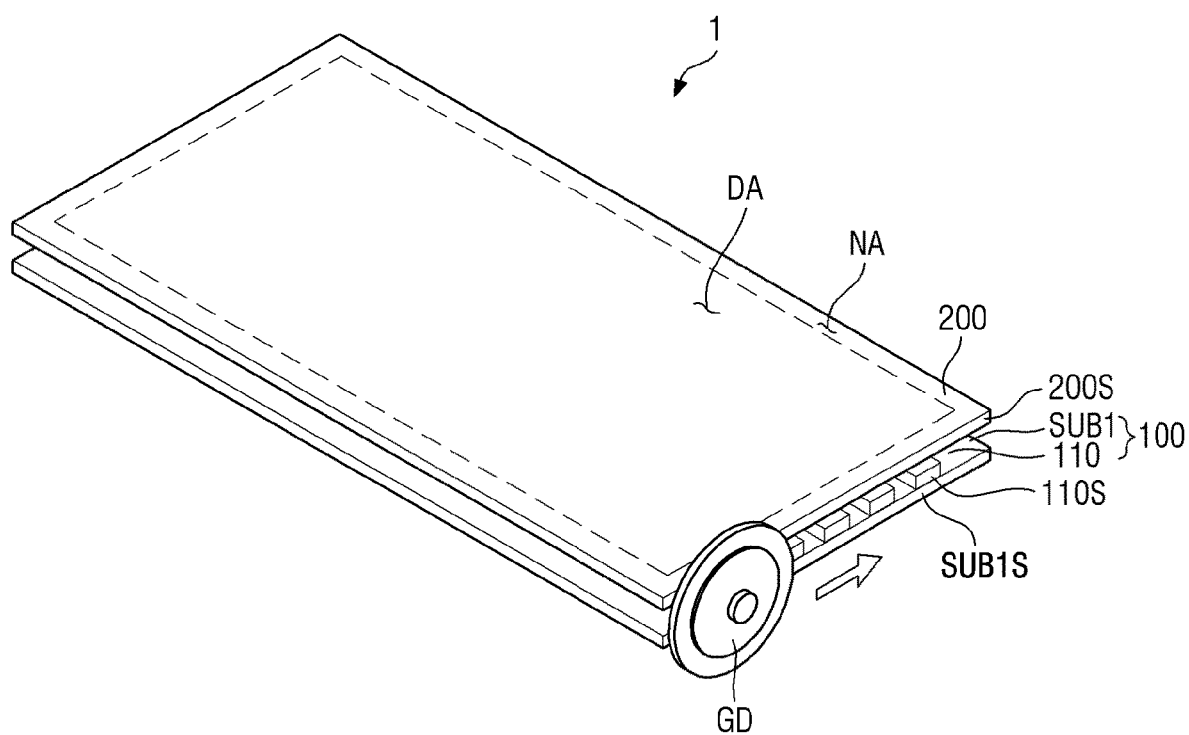
FIG. 25 is a perspective view illustrating one process step of the method of fabricating the display device of FIG. 24.
Figure 25:
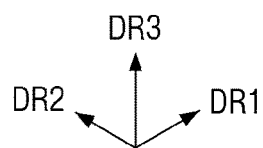
Figure 26:
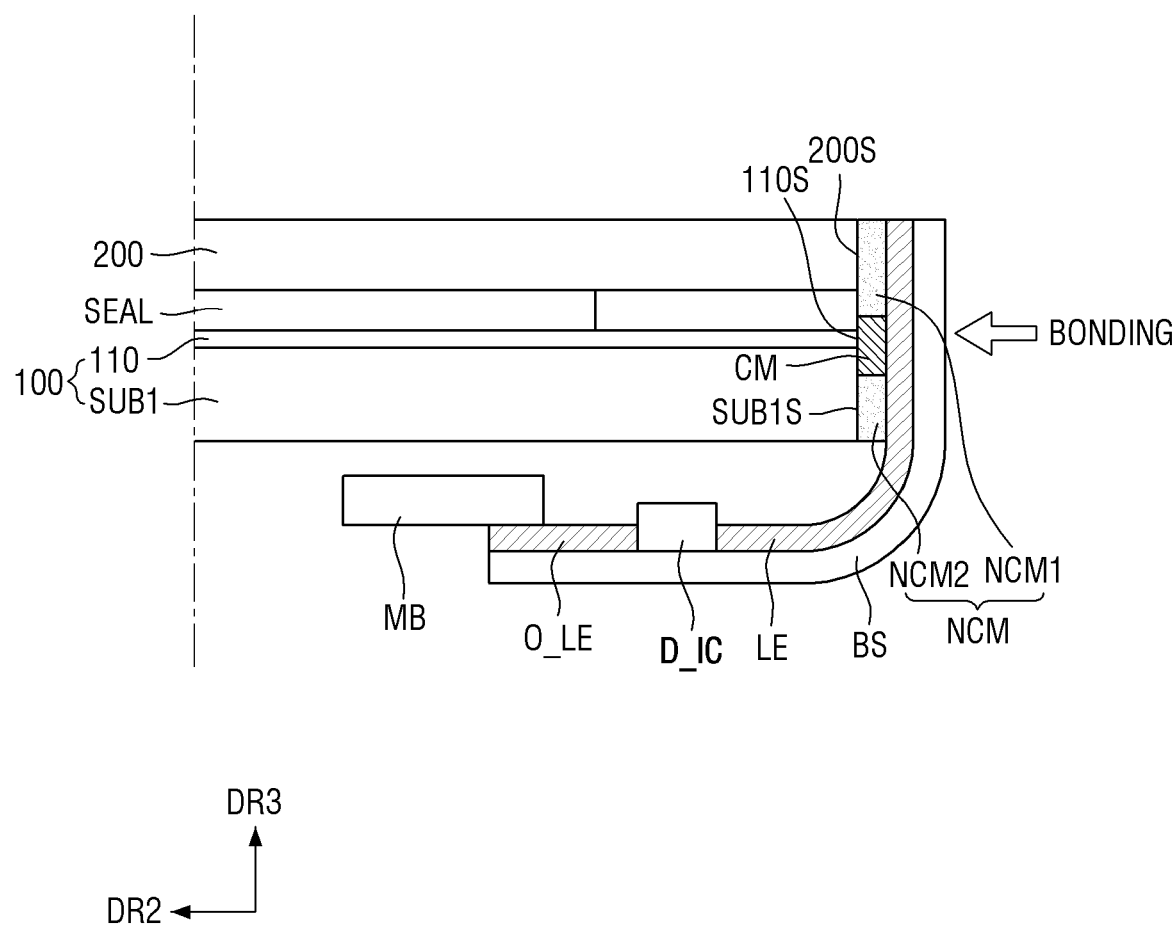
FIG. 26 is a cross-sectional view illustrating another process step of the method of fabricating the display device of FIG. 24.
Figure 27:
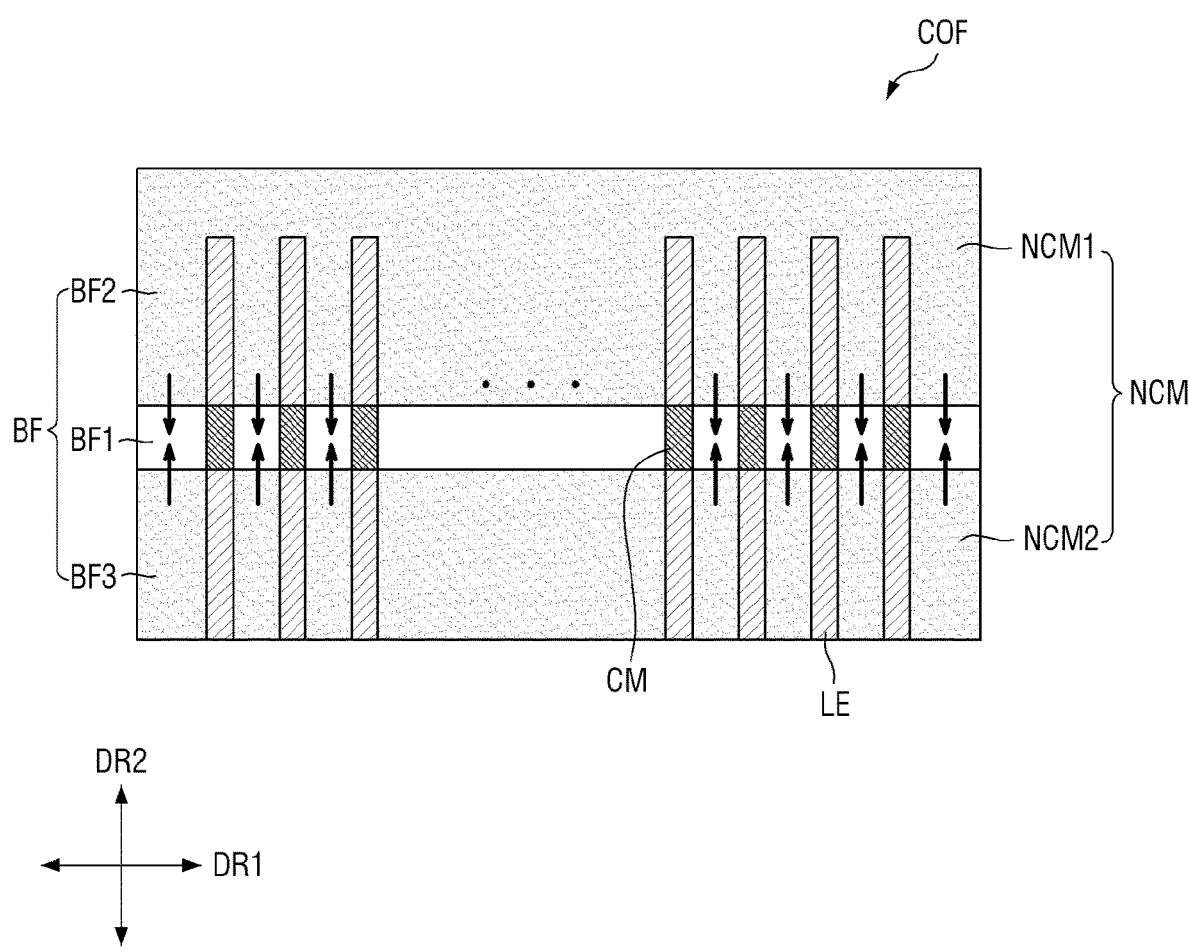
FIG. 27 is a plan view illustrating another process step of the method of fabricating the display device of FIG. 24.
Figure 28:
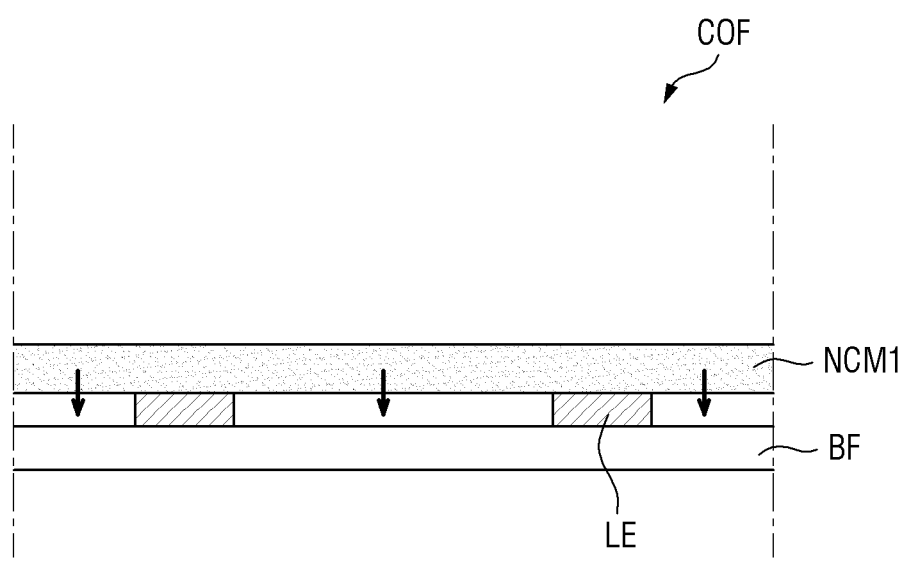
FIG. 28 is a cross-sectional view illustrating another process step of the method of fabricating the display device of FIG. 24.
Figure 28:
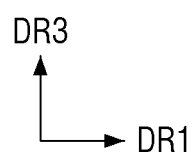

FIG. 24 is a flowchart illustrating an embodiment of a method of fabricating a display device according to the principles of the invention. FIG. 25 is a perspective view illustrating one process step of the method of fabricating the display device of FIG. 24. FIG. 26 is a cross-sectional view illustrating another process step of the method of fabricating the display device of FIG. 24. FIG. 27 is a plan view illustrating another process step of the method of fabricating the display device of FIG. 24. FIG. 28 is a cross-sectional view illustrating another process step of the method of fabricating the display device of FIG. 24.

With reference to FIGS. 24, 25, 26, and 27 28, the method of fabricating a display device according to an embodiment may include polishing, at step S10, the side surface 100S of the first substrate 100 including the first base substrate SUB1 and the connection wirings 110 on the first base substrate SUB1 and the side surface 200S of the second substrate 200 facing the connection wirings 110 and adhering, at step S20, the printed circuit film COF' on the side surfaces 100S and 200S of the first and second substrates 100 and 200.

First, with reference to FIGS. 24 and 25, the side surface 100S of the first substrate 100 including the first base substrate SUB1 and the connection wirings 110 on the first base substrate SUB1 and the side surface 200S of the second substrate 200 that faces the connection wirings 110 are polished at step S10.

The side surfaces 100S and 200S may be polished by a polishing device GD. The polishing device GD may include a mechanical polishing device, a chemical polishing device, and a chemical mechanical polishing device.

Next, with reference to FIGS. 24 and 26, the printed circuit film COF' is arranged on the side surface 100S of the first substrate 100 and the side surface 200S of the second substrate 200.

The conductive member CM may be arranged to overlap the side surface 110S of the connection wirings 110 in the second direction DR2.

Next, with reference to FIGS. 24 and 26, the printed circuit film COF' is bonded or connected to the first and second substrates 100 and 200 by means of a bonding device located outside the printed circuit film COF'. The bonding device may bond or connect the printed circuit film COF' and the first and second substrates 100 and 200 by applying heat and pressure from the outside the printed circuit film COF'. In more detail, if the bonding device applies heat and pressure, the conductive member CM and the non-conductive member NCM' may be at least partially melted by the heat and pressure.

Next, with reference to FIGS. 24, 27, and 28, the at least partially melted non-conductive member NCM' may fill the spaces between the adjacent lead wires LE in the second and third film portions BF2 and BF3 and the spaces between the adjacent lead wires LE in the first film portion BF1.

The at least partially melted non-conductive member NCM' may fill the spaces between the adjacent lead wires LE in the second and third film portions BF2 and BF3 and the spaces between the lead wires LE in the first film portion BF1 to directly contact the base film BF.

According to the embodiment, it may be possible to form a bonding member for connecting the printed circuit film COF' and the display panel (e.g., the first substrate 100, the second substrate 200, etc.) on the printed circuit film COF' and directly attach the bonding member to the connection wirings 110 of the first substrate 100 to dispense with the necessity of, for example, a side surface pad on the first and second substrates 100 and 200 for connection to the connection wirings 110. In order to form the side surface pad, it may be necessary to deposit a conductive material on the side surfaces of the first and second substrates 100 and 200 and pattern the deposited conductive material.

However, depositing and patterning the conductive material on the side surface of the display panel may be difficult due to the nature of the process requiring a separate jig.

Such a process may incur an alignment error because of the narrow width (e.g., fine pitch) between the side surface pad and lead wires LE. The alignment error may cause an increase of contact resistance as well as a short circuit between adjacent wires.

The method of fabricating a display device according to this embodiment is capable of bonding the display panel and the printed circuit film COF' with a bonding member arranged on the printed circuit film COF' immediately after polishing the side surface of the display panel, which can get rid of the necessity of the aforementioned processes (e.g., depositing and patterning steps), leading to process simplification.

As described above, the conductive member CM of the bonding member has the self-assembly property, which may improve the bonding force to the connection wirings 110 of the first substrate 100 of the display panel. This may minimize or prevent occurrence of alignment errors.

Hereinafter, a display device according to another embodiment will be described. In the following embodiment, the same components as those of the above-described embodiment are denoted by the same reference numerals, and a description thereof will be omitted or simplified for descriptive convenience.

Figure 29:
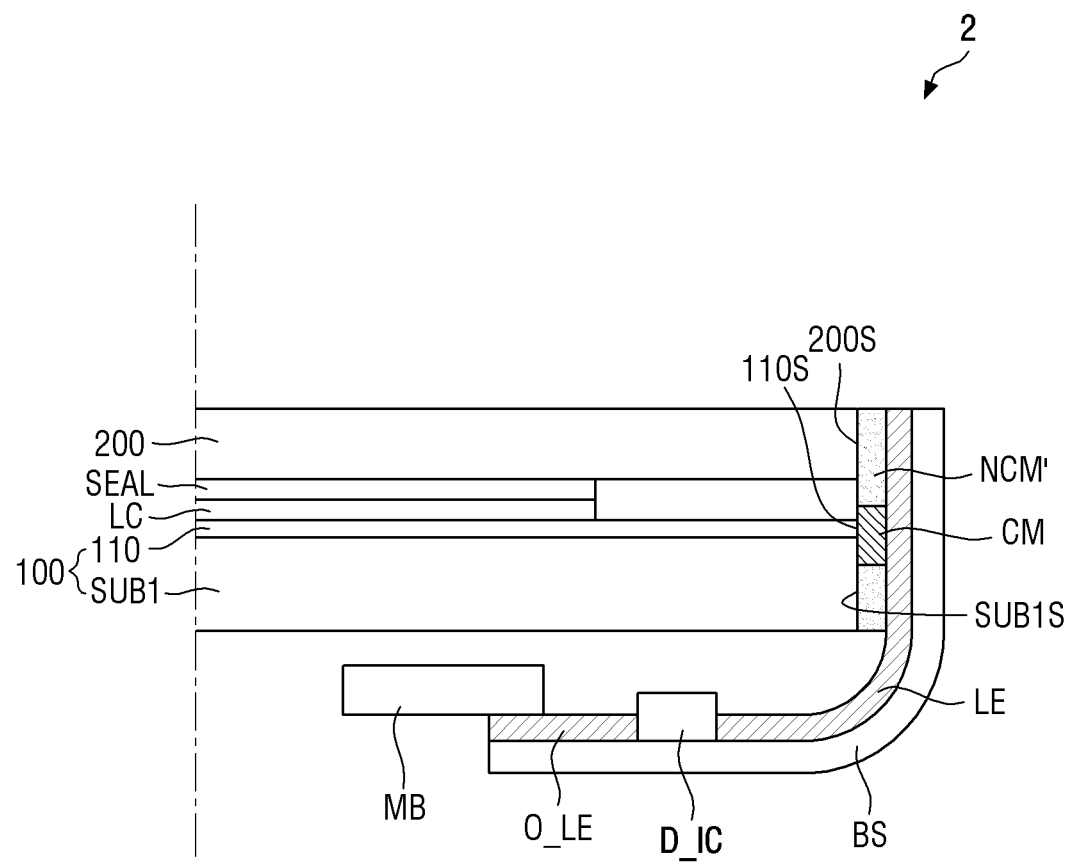
FIG. 29 is a cross-sectional view of another embodiment of the display device of FIG. 19.

FIG. 29 is a cross-sectional view of another embodiment of the display device of FIG. 19.

With reference to FIG. 29, a display device 2 according to this embodiment differs from the display device 1 of FIGS. 19 and 20 in that a liquid crystal display device is applied.

In more detail, a liquid crystal display device may be applied to the display device 2 according to the illustrated embodiment.

The display device 2 may further include a liquid crystal layer LC between the first and second substrates 100 and 200.

Other detailed descriptions made with reference to FIGS. 19 and 20 are omitted hereinafter to avoid redundancy for descriptive convenience.

Figure 30:
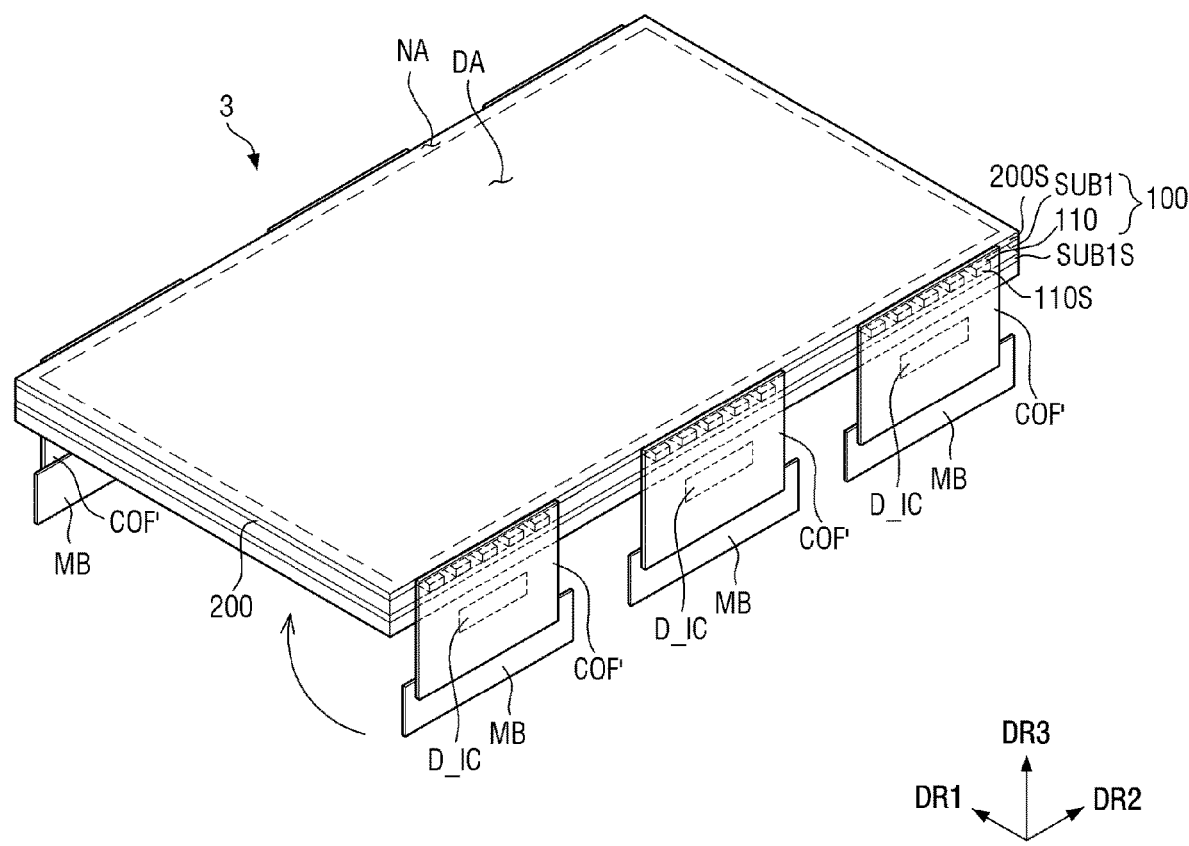
FIG. 30 is a perspective view of another embodiment of the display device of FIG. 19.

FIG. 30 is a perspective view of another embodiment of the display device of FIG. 19.

With reference to FIG. 30, a display device 3 according to this embodiment differs from the display device 1 of the above-described embodiment in that a plurality of printed circuit films COF' may be arranged.

In more detail, the display device 3 according to this embodiment may include a plurality of printed circuit films COF' arranged therein.

Although the plurality of printed circuit films COF' may be arranged along the long sides of the first and second substrates 100 and 200, embodiments are not limited thereto.

Figure 31:
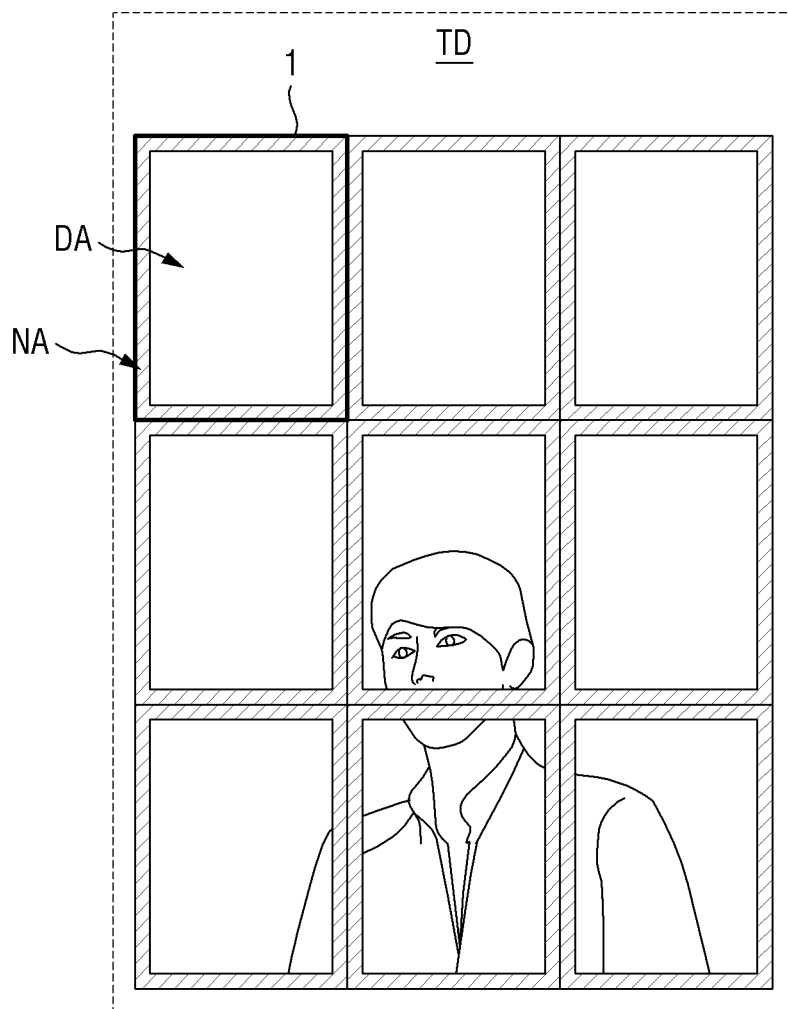
FIG. 31 is a plan view of another embodiment of the display device of FIG. 19.

FIG. 31 is a plan view of another embodiment of the display device of FIG. 19.

With reference to FIG. 31, the display device according to this embodiment differs from the display device 1 of FIGS. 19 and 20 in that a tiled display device TD is applied.

In more detail, in an embodiment, a plurality of display devices may be arranged in the form of a grid, a row in a direction, a shape of two intersecting rows, and a specific shape, but embodiments are not limited thereto. The plurality of display devices may have the substantially same size, but embodiments are not limited thereto, and the plurality of display devices may have different sizes.

The description of each display device 1 that has been already made with reference to FIGS. 19 and 20 is omitted hereinafter to avoid redundancy.

The plurality of display devices 1 may be arranged such that the long or short sides thereof are connected to each other. In addition, some display devices 1 may form a side of the tiled display device TD, some display devices 1 may be positioned at the corner of the tiled display device TD to form two adjacent sides, and some display devices 1 may be positioned inside the tiled display device TD while being surrounded by other display devices 1. The plurality of display devices 1 may have different shapes of bezels according to relative locations thereof or may have the substantially same shape of a bezel.

Although the tiled display device TD may be a flat display device 1, embodiments are not limited thereto, and the tiled display device TD may have a three-dimensional shape for producing a three-dimensional effect. In the case where the tiled display device TD has a three-dimensional shape, individual display devices 1 constituting the tiled display device TD may each have a curved shape or a flat shape, and may be connected to form a certain angle therebetween to achieve the three-dimensional shape of the whole tiled display device TD.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of fabricating a printed circuit film, comprising the steps of:
   preparing a base film, and a plurality of lead wires disposed on the base film, the plurality of lead wires spaced apart from each other in a first direction and extending in a second direction intersecting the first direction; and
   forming a bonding member comprising a conductive member disposed to overlap only a central portion of each of the plurality of lead wires, a first non-conductive member disposed to overlap a first portion of the plurality of lead wires in the second direction, and a second non- conductive member disposed to overlap a second portion of the plurality of lead wires in the second direction,
   wherein the central portion is disposed between the first portion and the second portion and the conductive member does not overlap the first non-conductive portion and the second non-conductive portion.

2. The method of claim 1, wherein the conductive member comprises a solder material.

3. The method of claim 1, wherein:
   the conductive member is formed on the plurality of lead wires, and
   the conductive member comprises a metal paste, a metal film, or metal particles.

4. The method of claim 1, wherein each of the first non-conductive member and the second non-conductive member comprises at least one of resin, urethane, or epoxy.

5. The method of claim 1, wherein the conductive member is disposed so as not to overlap a space between adjacent lead wires.

6. The method of claim 1, further comprising the steps of:
   hydrophilically processing a surface of each of the plurality of lead wires facing the bonding member after the preparing of the plurality of lead wires; and
   hydrophobically processing a surface of the base film facing the plurality of lead wires and not overlapping the plurality of lead wires.

7. A method of fabricating a display device, comprising the steps of:
   polishing side surfaces of a first substrate, a first substrate comprising a connection wiring on the first substrate, and a second substrate facing the first substrate; and
   adhering a printed circuit film onto the polished side surfaces of the first substrate and the second substrate,
   wherein the printed circuit film comprises a base film, lead wires on the base film, and a bonding member configured to attach the printed circuit film to the first substrate and the second substrate, and
   the bonding member comprises a conductive member connecting the lead wires to the connection wiring, and a non-conductive member disposed around the conductive member and disposed in a first space between adjacent lead wires but not disposed in a second space between the adjacent lead wires having the conductive member disposed thereon.

8. The method of claim 7, wherein the step of adhering of the printed circuit film onto the side surfaces of the first substrate and the second substrate comprises the steps of:
  placing the printed circuit film on the polished side surfaces of the first substrate and the second substrate; and
  applying heat and pressure from an outside of the printed circuit film.

* * * * *